(12) United States Patent
Kawashima

(10) Patent No.: US 9,093,168 B2
(45) Date of Patent: Jul. 28, 2015

(54) NONVOLATILE LATCH CIRCUIT AND MEMORY DEVICE

(71) Applicant: FUJITSU SEMICONDUCTOR LIMITED, Yokohama-shi, Kanagawa (JP)

(72) Inventor: Shoichiro Kawashima, Yokahama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 133 days.

(21) Appl. No.: 13/772,571

(22) Filed: Feb. 21, 2013

(65) Prior Publication Data

US 2013/0229849 A1    Sep. 5, 2013

(30) Foreign Application Priority Data

Mar. 5, 2012 (JP) ................................ 2012-048212
Jul. 26, 2012 (JP) ................................ 2012-166231

(51) Int. Cl.
  *G11C 11/22* (2006.01)
  *G11C 11/412* (2006.01)
  *G11C 14/00* (2006.01)

(52) U.S. Cl.
  CPC ............ *G11C 11/221* (2013.01); *G11C 11/412* (2013.01); *G11C 14/0072* (2013.01)

(58) Field of Classification Search
  USPC ........................................................ 365/145
  See application file for complete search history.

(56) References Cited

U.S. PATENT DOCUMENTS

| | | | |
|---|---|---|---|
| 5,029,128 A | 7/1991 | Toda | |
| 6,141,237 A | 10/2000 | Eliason et al. | |
| 6,853,576 B2* | 2/2005 | Kato et al. | 365/145 |
| 6,934,178 B2 | 8/2005 | Yokozeki et al. | |
| 7,227,769 B2 | 6/2007 | Fukushi et al. | |
| 7,266,009 B2 | 9/2007 | Chandler et al. | |
| 7,414,876 B2* | 8/2008 | Kang | 365/145 |
| 2002/0051376 A1* | 5/2002 | Yamamoto et al. | 365/145 |
| 2004/0042286 A1* | 3/2004 | Kato et al. | 365/200 |

FOREIGN PATENT DOCUMENTS

| | | |
|---|---|---|
| JP | 02-110895 | 4/1990 |
| JP | 2004-87003 A | 3/2004 |
| JP | 2008-234829 A | 10/2008 |
| WO | WO 2004/107350 A1 | 12/2004 |

* cited by examiner

*Primary Examiner* — Anthan Tran
(74) *Attorney, Agent, or Firm* — Arent Fox LLP

(57) ABSTRACT

A nonvolatile latch circuit includes: a latch circuit part; a charge absorption circuit part; and a first ferroelectric capacitor having a first electrode connected to a plate line and a second electrode connected to the charge absorption circuit part, wherein when information is read from the first ferroelectric capacitor to the latch circuit part, the plate line is operated to cause the charge absorption circuit part to absorb at least part of charges outputted from the first ferroelectric capacitor so as to suppress variation in potential of the second electrode of the first ferroelectric capacitor.

8 Claims, 21 Drawing Sheets

F I G. 1
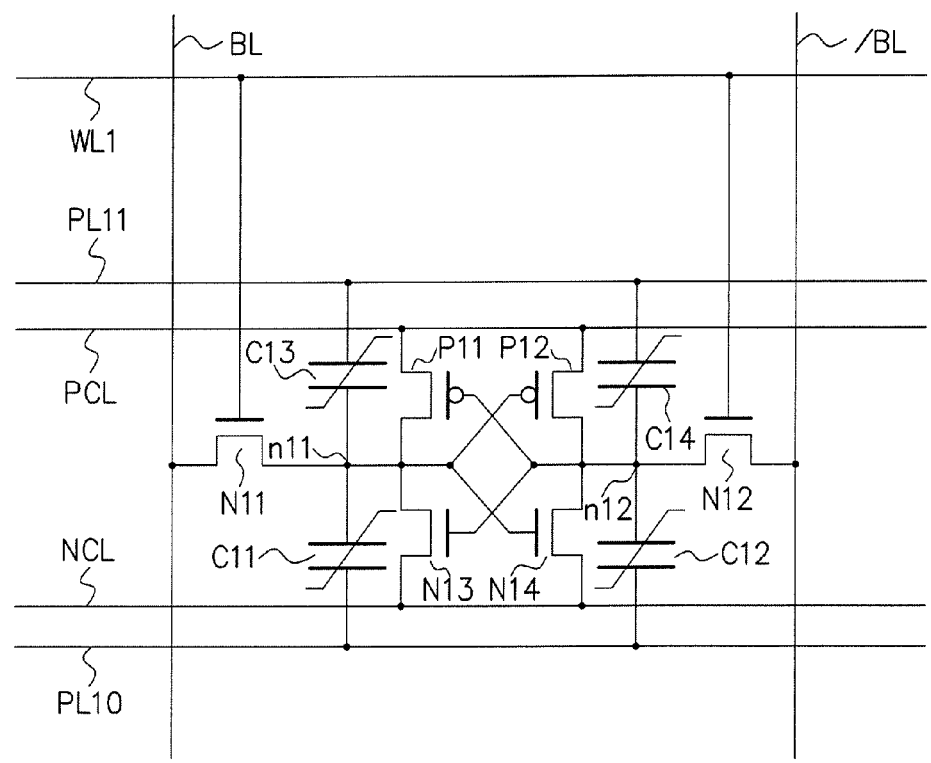
F I G. 2
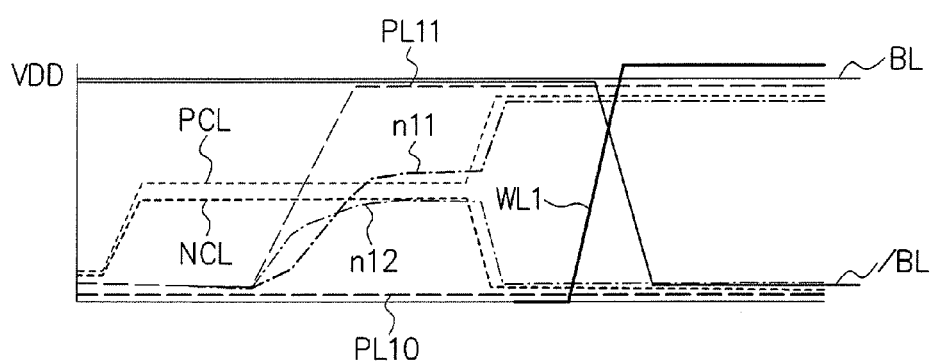

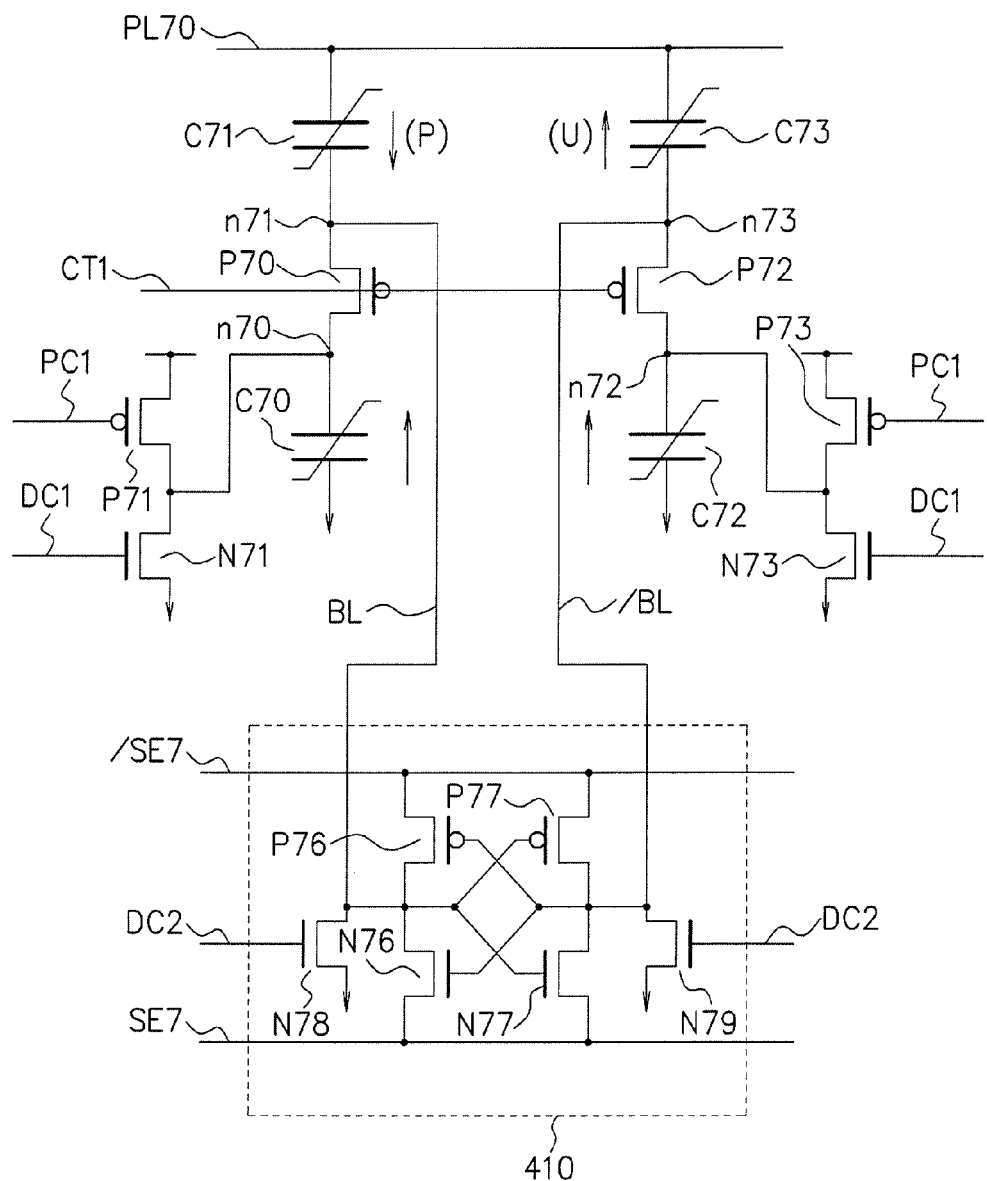
F I G. 4

F I G. 6
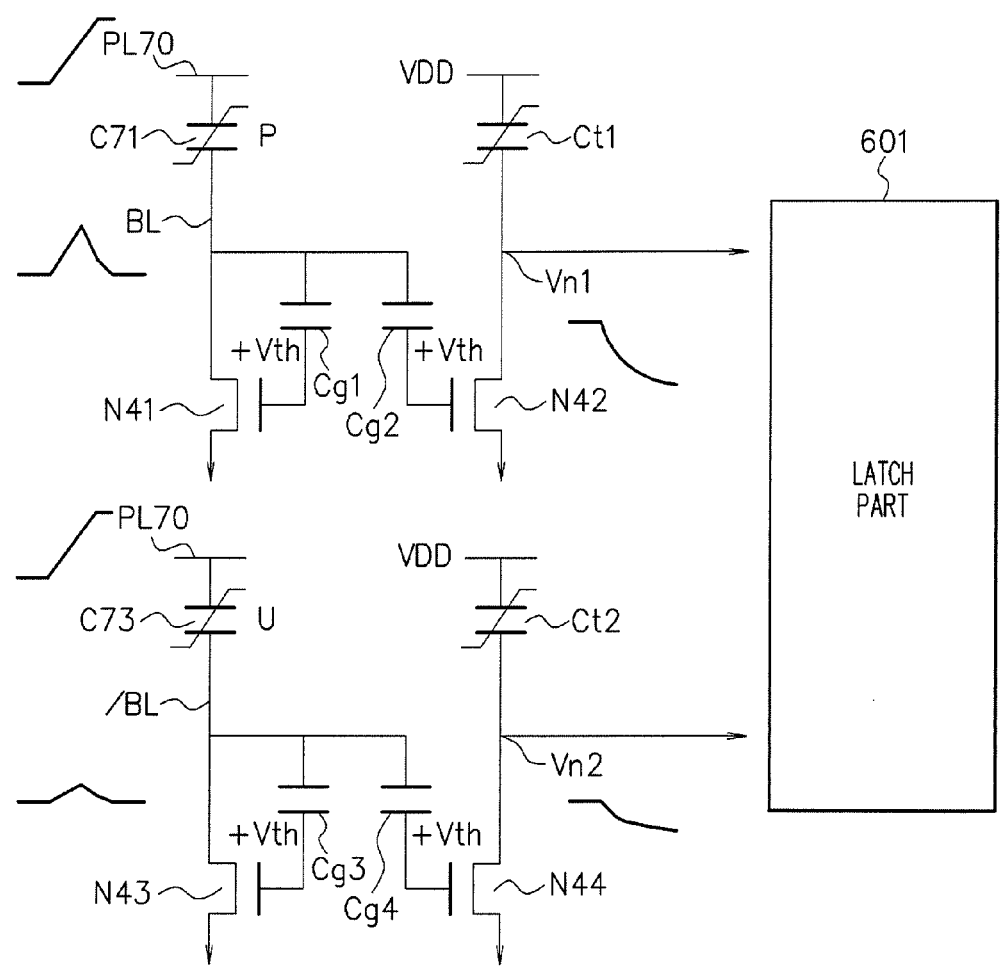

F I G. 11
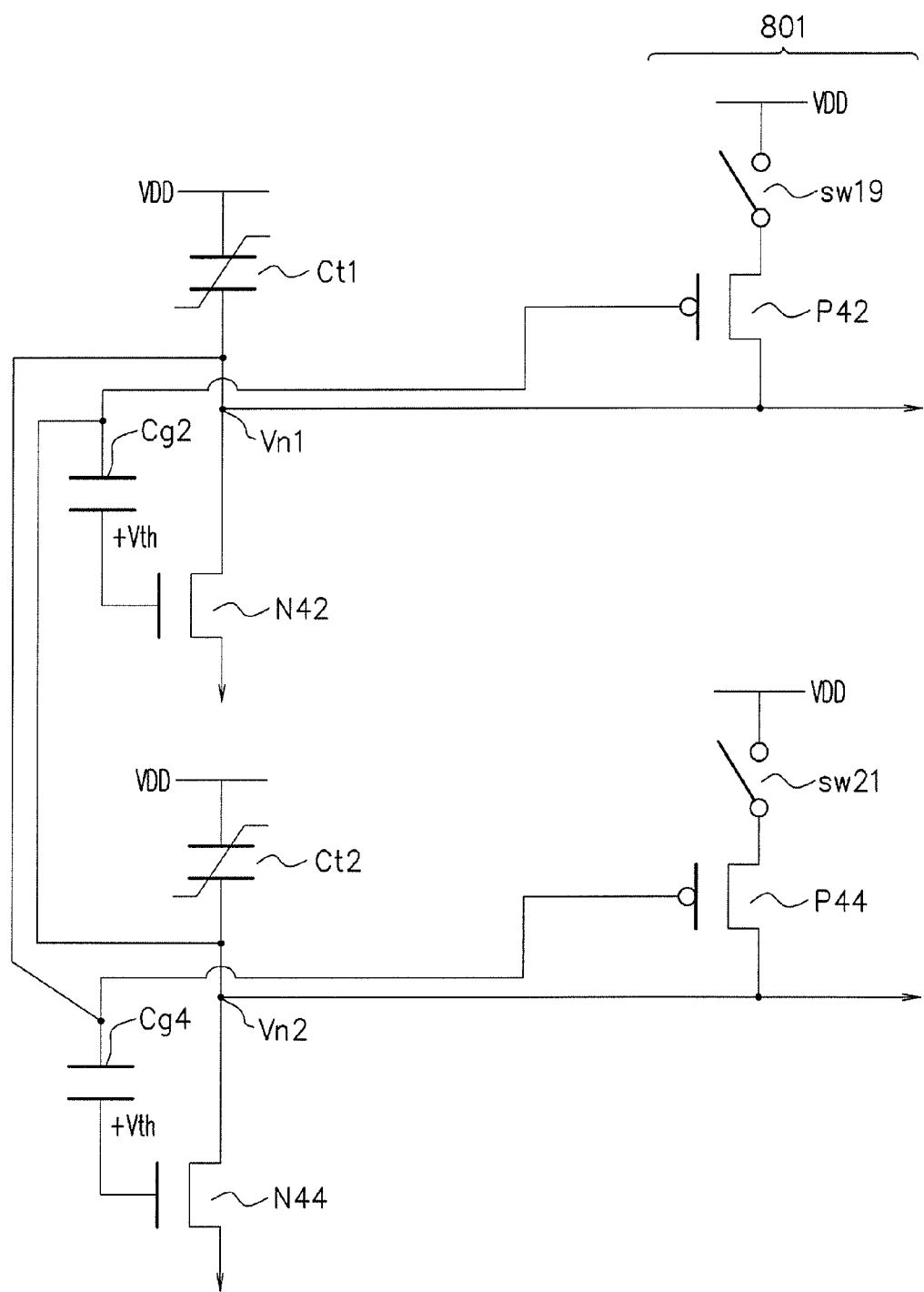

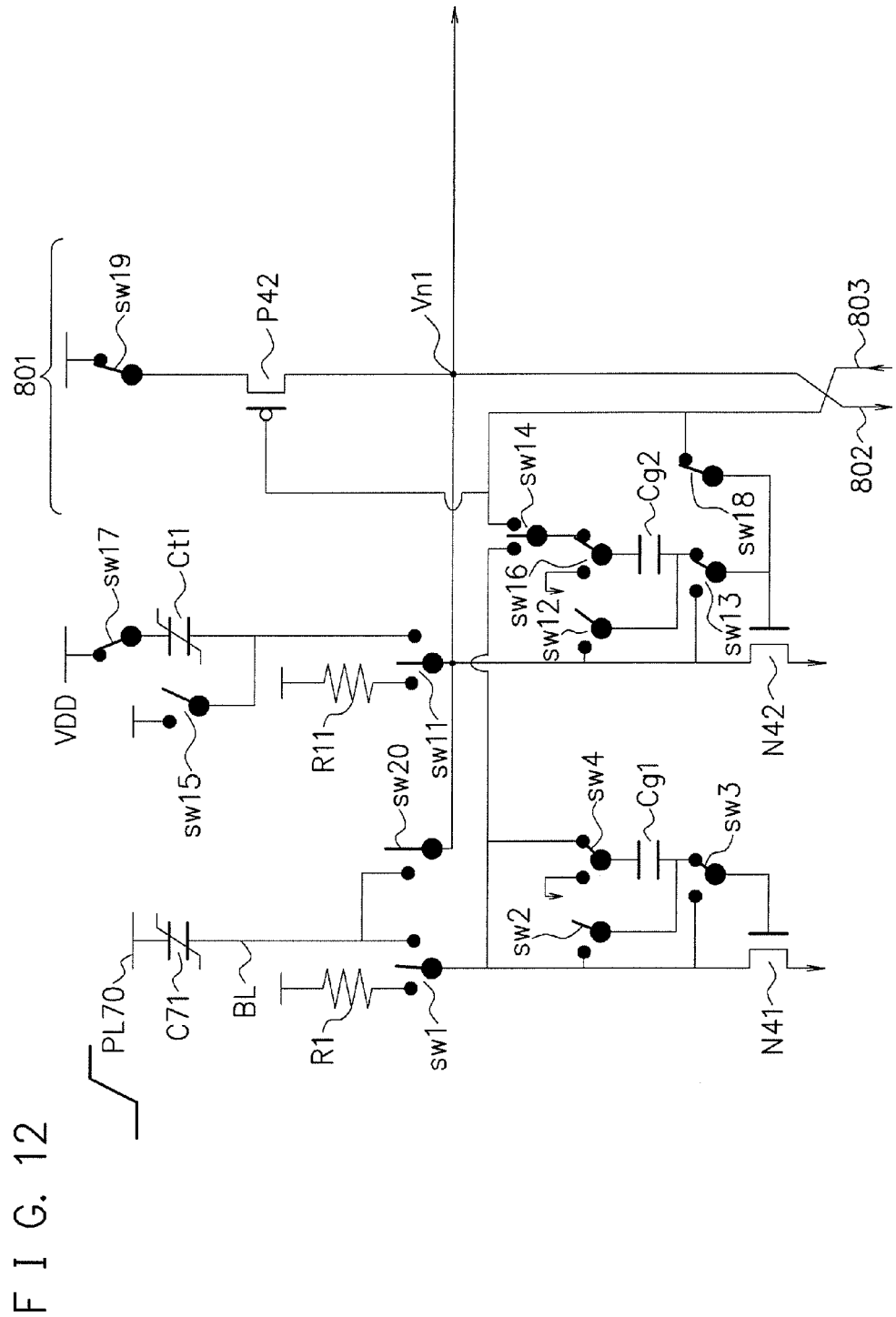
F I G. 12

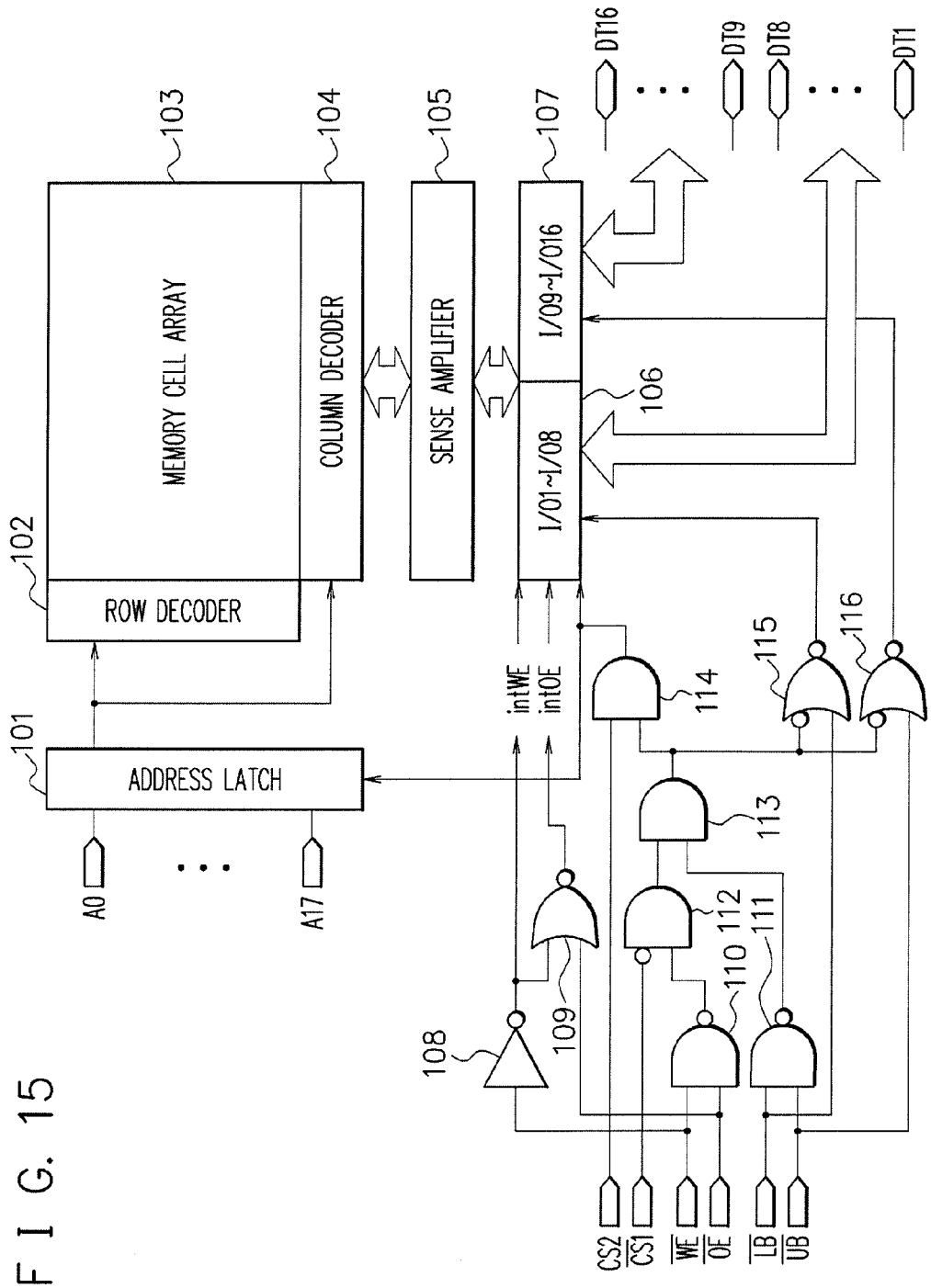
F I G. 15

F I G. 17
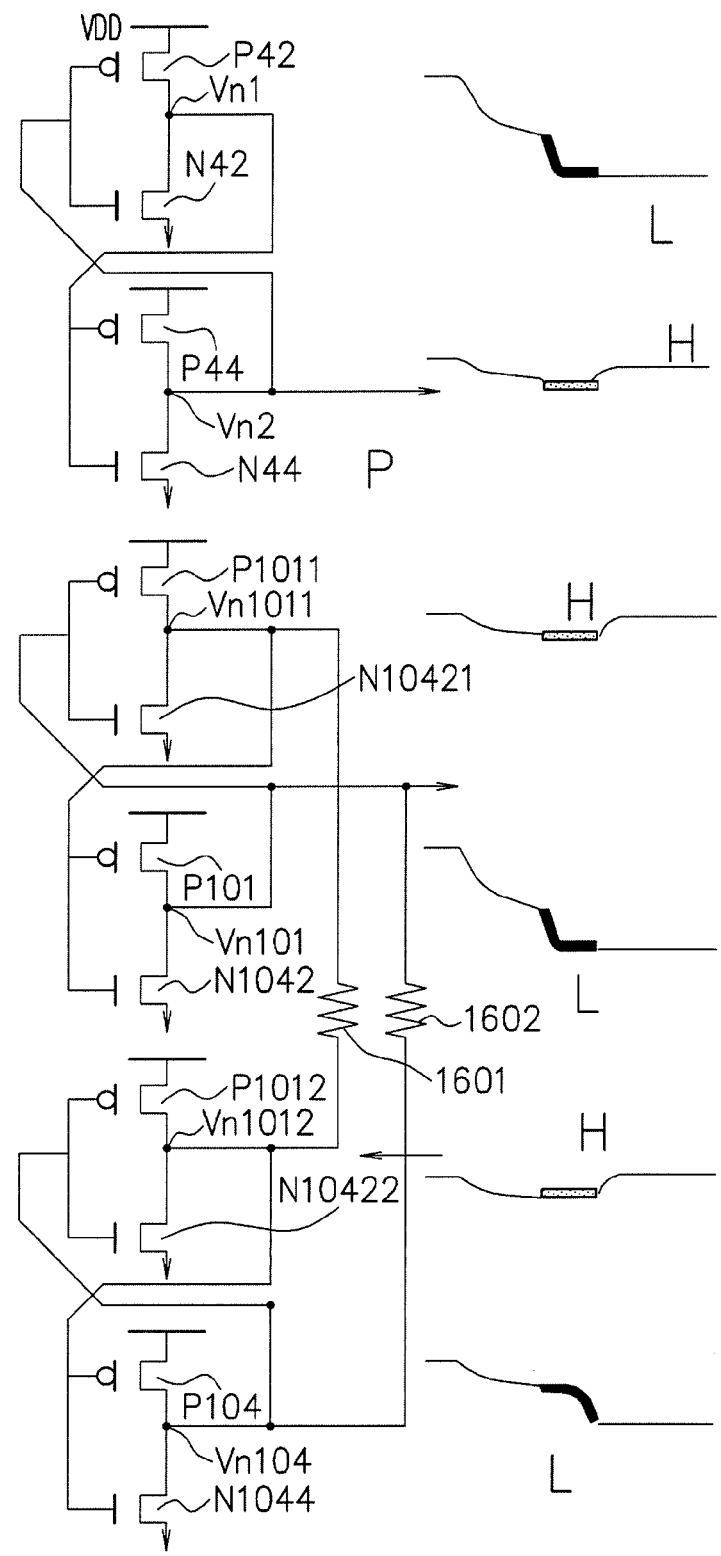

F I G. 19
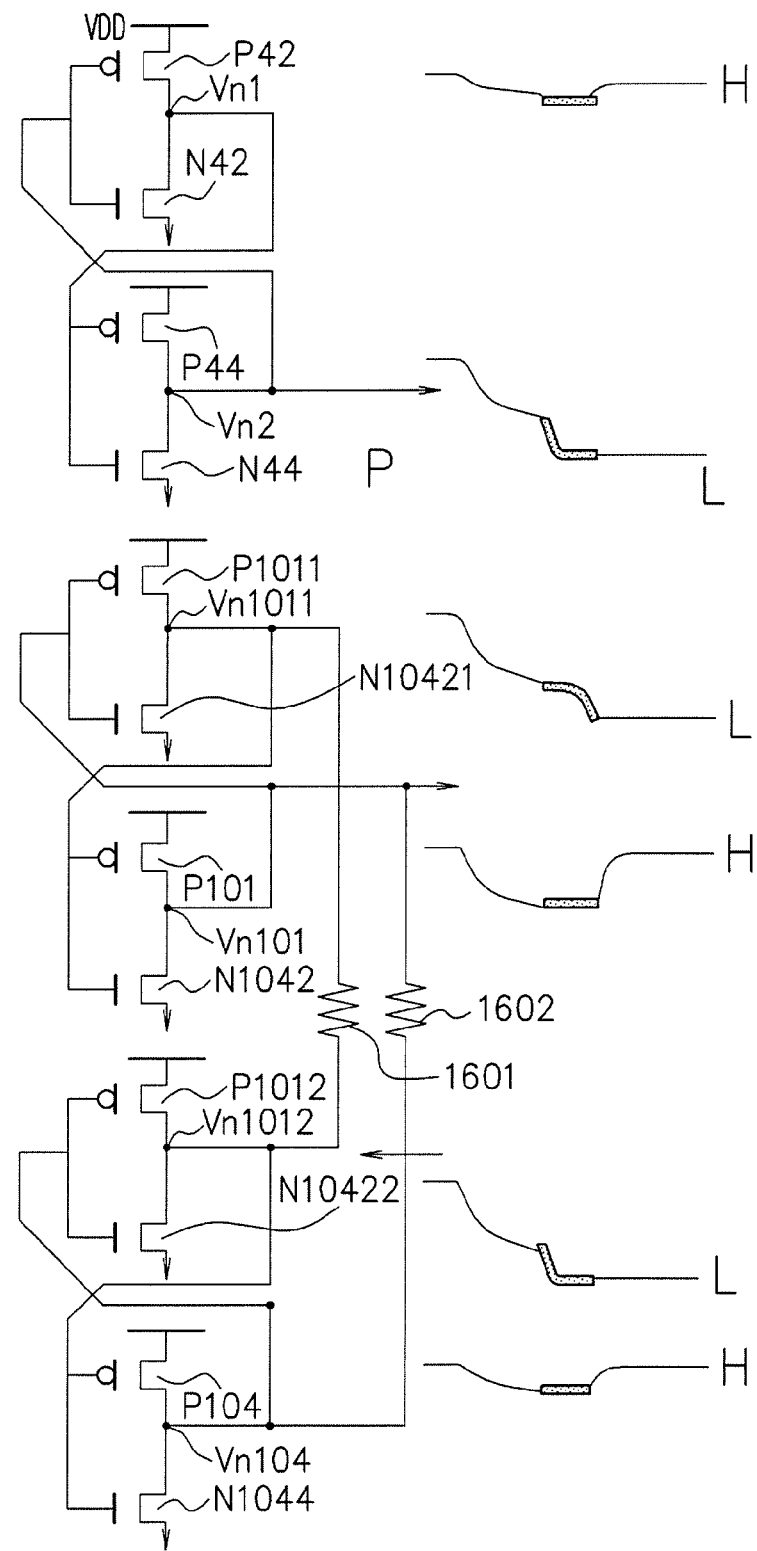

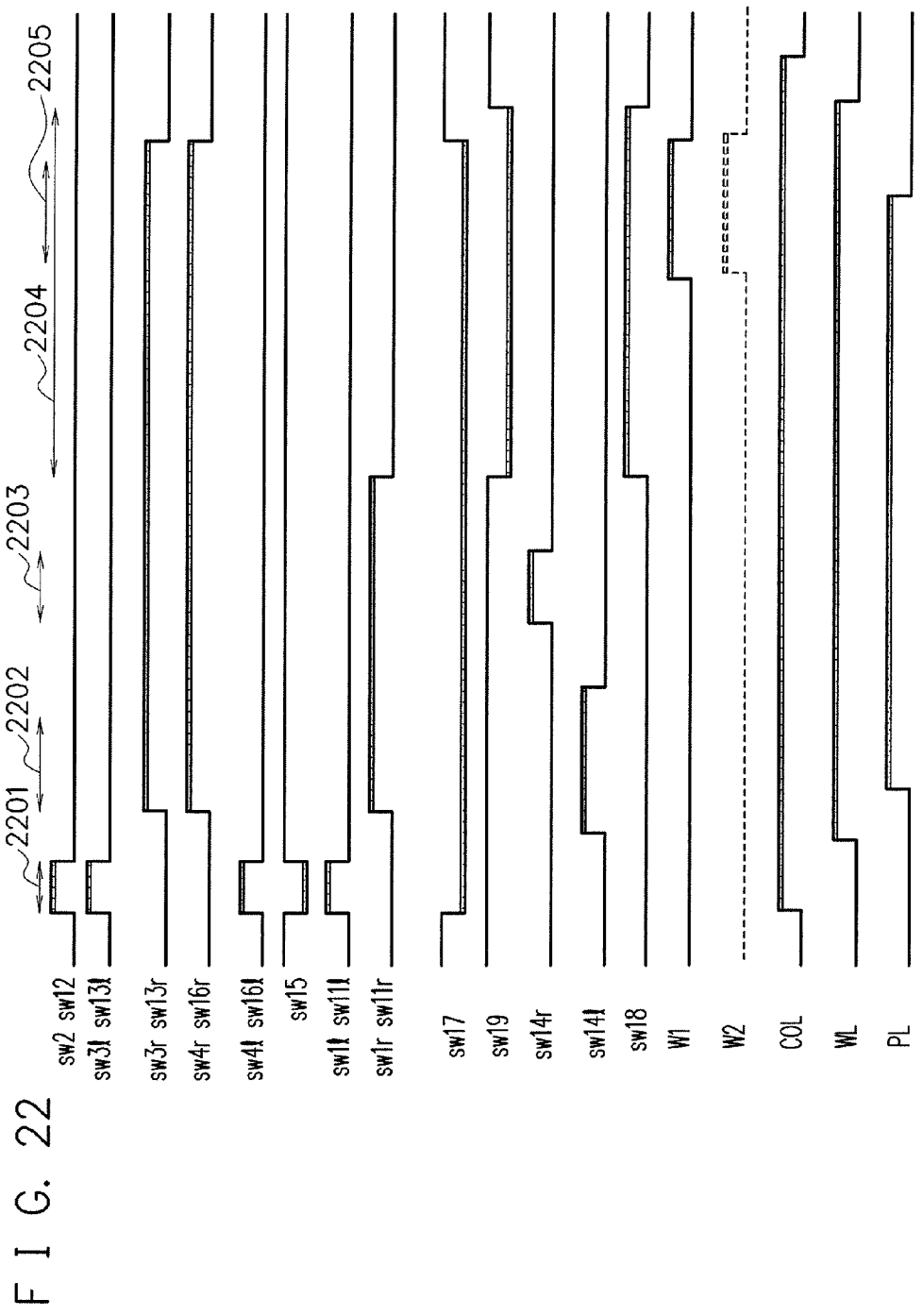

NONVOLATILE LATCH CIRCUIT AND MEMORY DEVICE

CROSS-REFERENCE TO RELATED APPLICATIONS

This application is based upon and claims the benefit of priority of the prior Japanese Patent Application No. 2012-048212, filed on Mar. 5, 2012, and the Japanese Patent Application No. 2012-166231, filed on Jul. 26, 2012, the entire contents of which are incorporated herein by reference.

FIELD

The embodiments discussed herein are directed to a nonvolatile latch circuit and a memory device.

BACKGROUND

As a nonvolatile latch circuit using a ferroelectric capacitor, a 6T2C-type nonvolatile latch circuit using 6 transistors and 2 capacitors (see, for example, Patent Document 1) and a 6T4C-type nonvolatile latch circuit using 6 transistors and 4 capacitors (see, for example, Patent Document 2) are known.

Further, a semiconductor memory that has: a memory cell having a capacitor that stores charges according to the logic of data; a bit line connected to the memory cell; a charge transfer circuit connected to the bit line; a charge storage circuit that is connected to the bit line via the charge transfer circuit, stores charges read from the memory cell to the bit line during read operation, and generates a read voltage according to the stored charges; and a read circuit that generates the logic of data held in the memory cell according to the read voltage generated by the charge storage circuit is known (see, for example, Patent Document 3).

Further, a semiconductor memory having a sense amplifier system that detects and amplifies a potential variation in a pair of bit lines generated by a memory cell of a ferroelectric capacitor is known (see, for example, Patent Document 4).

Further, a ferroelectric memory having a plurality of normal memory cells having ferroelectric capacitors that store data supplied from the outside respectively, a second memory cell having a ferroelectric capacitor that stores inversion data of first data stored in a first memory cell among the normal memory cells, and bit lines connected to the normal memory cells and the second memory cell respectively is known (see, for example, Patent Document 5).

Patent Document 1: U.S. Pat. No. 6,141,237
Patent Document 2: Japanese Laid-open Patent Publication No. 2004-87003
Patent Document 3: Japanese Laid-open Patent Publication No. 2008-234829
Patent Document 4: Japanese Examined Patent Application Publication No. 8-8339
Patent Document 5: International Publication Pamphlet No. WO 2004/107350

SUMMARY

A nonvolatile latch circuit includes: a latch circuit part; a charge absorption circuit part; and a first ferroelectric capacitor having a first electrode connected to a plate line and a second electrode connected to the charge absorption circuit part, wherein when information is read from the first ferroelectric capacitor to the latch circuit part, the plate line is operated to cause the charge absorption circuit part to absorb at least part of charges outputted from the first ferroelectric capacitor so as to suppress variation in potential of the second electrode of the first ferroelectric capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a circuit diagram illustrating a configuration example of a nonvolatile latch circuit;

FIG. 2 is a voltage waveform diagram for explaining a read operation of the nonvolatile latch circuit in FIG. 1;

FIG. 4 is a circuit diagram illustrating a configuration example of a nonvolatile latch circuit according to a first embodiment

FIG. 6 is a circuit diagram illustrating a configuration example of a principle of nonvolatile latch circuit according to a second embodiment;

FIG. 11 corresponds to FIG. 10 and FIG. 6 and is a circuit diagram illustrating a 1st step latching configuration example of nMOS cross-coupling of a latch part;

FIG. 12 is a circuit diagram illustrating a 2nd step CMOS latching configuration example of the nonvolatile latch circuit according to the third embodiment;

FIG. 15 is a diagram illustrating a organization example of a ferroelectric memory device according to a fourth embodiment;

FIG. 17 is a diagram illustrating a 2nd step latching operation by cross-coupling of n-channel and p-channel field effect transistors;

FIG. 19 is a diagram illustrating a 2nd step latching operation by cross-coupling of n-channel and p-channel field effect transistors;

FIG. 22 is a timing chart illustrating examples of control signals of the ferroelectric memory device.

DESCRIPTION OF EMBODIMENTS

Reference Technique

FIG. 1 is a circuit diagram illustrating a configuration example of a nonvolatile latch circuit, and FIG. 2 is a voltage waveform diagram for explaining a read operation of the nonvolatile latch circuit in FIG. 1. The nonvolatile latch circuit has ferroelectric capacitors C11 to C14, p-channel field effect transistors P11, P12, and n-channel field effect transistors N11 to N14. The ferroelectric capacitors C13 and C14 are capacitors for storing complementary information. The ferroelectric capacitors C11 and C12 are capacitors for loads.

Figure 3:
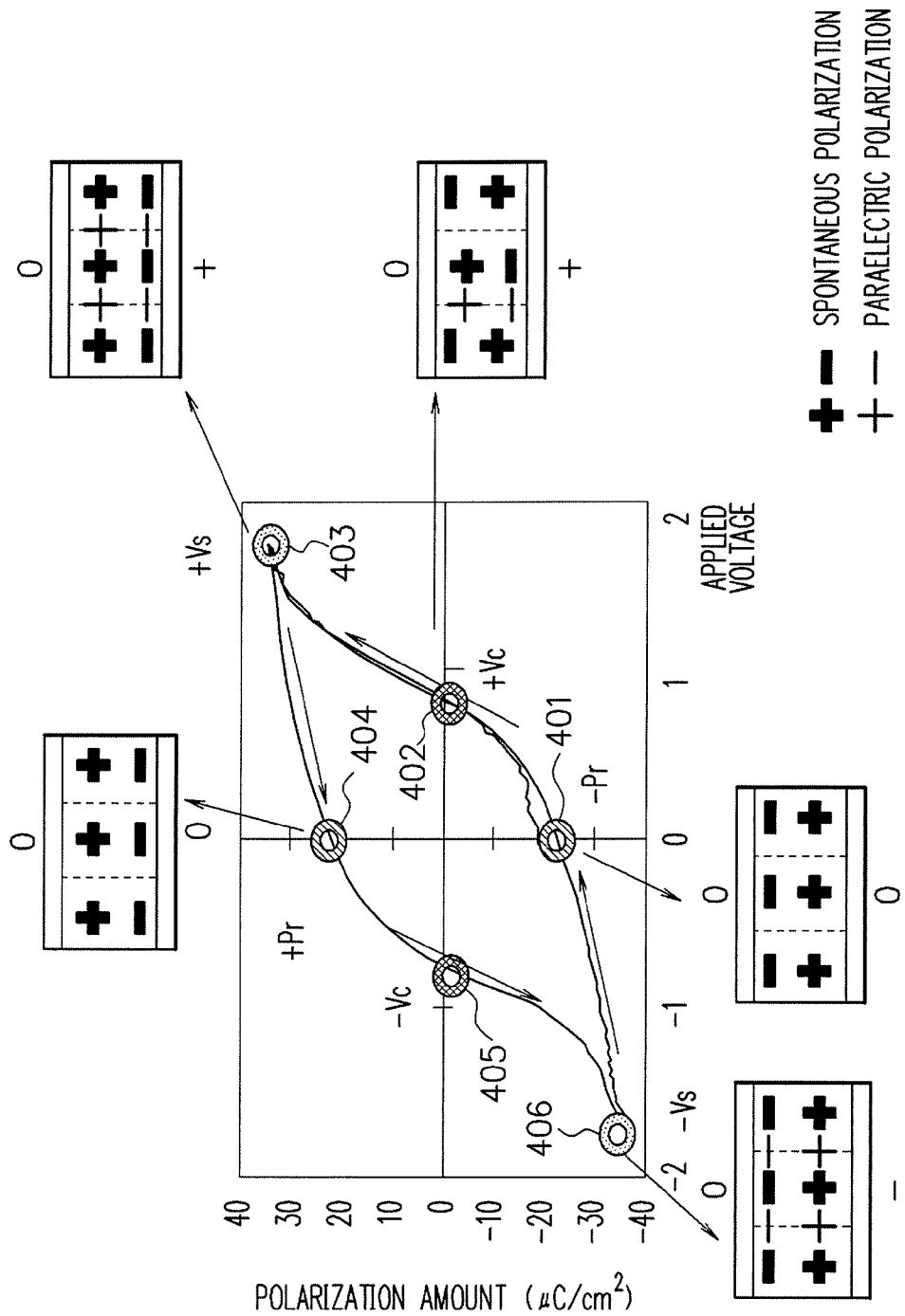
FIG. 3 is a diagram illustrating hysteresis characteristics of ferroelectric capacitors.

FIG. 3 is a diagram illustrating hysteresis characteristics of the ferroelectric capacitors C11 to C14. The horizontal axis indicates an applied voltage, the vertical axis indicates an amount of polarization, amounts of polarization +Pr (point 404) and −Pr (point 401) are amounts of remnant polarization, voltages +Vc and −Vc are coercive voltages, and voltages +Vs and −Vs are saturation voltages. The ferroelectric capacitors C11 to C14 have hysteresis characteristics of passing through points 401 to 406 and then returns to point 401 when applying a cycle of voltage, 0V, +Vs, 0V, −Vs, and 0V. Generally, amount of charge by reading path through the point 401 to the point 403 is called a P-term which involves polarization change and emits a large amount of charge involving 2Pr. Amount of charge by reading path through the point 404 to the point 403 is called U-term, which does not involve polarization change and emits relatively small amount of charge. Hereinafter, the capacitor state at the point −Pr 401 is called a P-term state capacitor, and the capacitor state at the point +Pr 404 is called a U-term state capacitor. For example, the ferroelectric capacitor C13 stores information of data "1" corresponding to the point −Pr 401 and called a P-term state capacitor, and the ferroelectric capacitor C11 stores information of data "0" corresponding to the point +Pr 404 and called a U-term state capacitor. The ferroelectric capacitor C14 stores information of data "0" corresponding to the point +Pr 404 and called a U-term state capacitor, and the ferroelectric capacitor C12 stores information of data "1" corresponding to the point −Pr 401 and called a P-term state capacitor.

In FIG. 2, first, lines PCL and NCL are set to an intermediate potential, plate lines PL10 and PL11 are set to low level, and a word line WL1 is set to low level.

Next, the plate line PL11 is set to high level. Then, a node 11 converges to a high voltage because of polarization inversion of the ferroelectric capacitor C13 due to storage of the state of the −Pr 401 which was a P-term state and no polarization inversion of the ferroelectric capacitor C11 due to storage of the state of the +Pr 404 which was a U-term state, whereas a node 12 converges to a low voltage because of no polarization inversion of the ferroelectric capacitor C14 due to storage of the state of the +Pr 404 which was a U-term state and polarization inversion of the ferroelectric capacitor C12 due to storage of the state of the −Pr 404 which was a P-term state.

Next, the power supply potential line PCL is set to a power supply potential, and the reference potential line NCL is set to a reference potential. Then, the high voltage of the node n11 is amplified to high level, and the low voltage of the node n12 is amplified to low level. Signals at the nodes n11 and n12 are amplified to rail to rail digital signals.

Next, the word line WL1 is set to high level. Then, the transistors N11 and N12 are turned on, and a bit line BL becomes high level as with the node n11 and a bit line /BL becomes low level as with the node n12.

This makes it possible to read the information stored in the ferroelectric capacitors C13 and C14 to the bit lines BL and /BL To enable operation even at a low power supply voltage of 1.8 V, the capacitors C11 and C12 for loads are provided. An equivalent capacitance ratio between the ferroelectric capacitors C12 and C13 at the point −Pr 401 for the P-term state and the ferroelectric capacitors C11 and C14 at the point +Pr 404 for the U-term state is 3:1. The ferroelectric capacitors C11 and C13 are connected in series, and the ferroelectric capacitors C12 and C14 are connected in series. Therefore, a voltage obtained by dividing the power supply voltage to 1/4 is applied to the ferroelectric capacitors C12 and C13 for the P-term state, and a voltage obtained by dividing the power supply voltage to 3/4 is applied to the ferroelectric capacitors C11 and C14 for the U-term state. When the power supply voltage is 3 V, a voltage of about 0.75 V (=3/4 V) is applied to the ferroelectric capacitor C13 for the P-term state, that is, a voltage very close to the coercive voltage (inversion voltage) is applied. When the power supply voltage is 1.8 V, however, only 0.45 V (=1.8/4 V) is applied to the ferroelectric capacitor C13 for the P-term state, that is, a voltage less than the coercive voltage is applied to them, failing to obtain sufficient read charges.

Hereinafter, embodiments of a nonvolatile latch circuit capable of reading a sufficient amount of charges from a ferroelectric capacitor by applying a high voltage to the ferroelectric capacitor will be described.

First Embodiment

Figure 5:
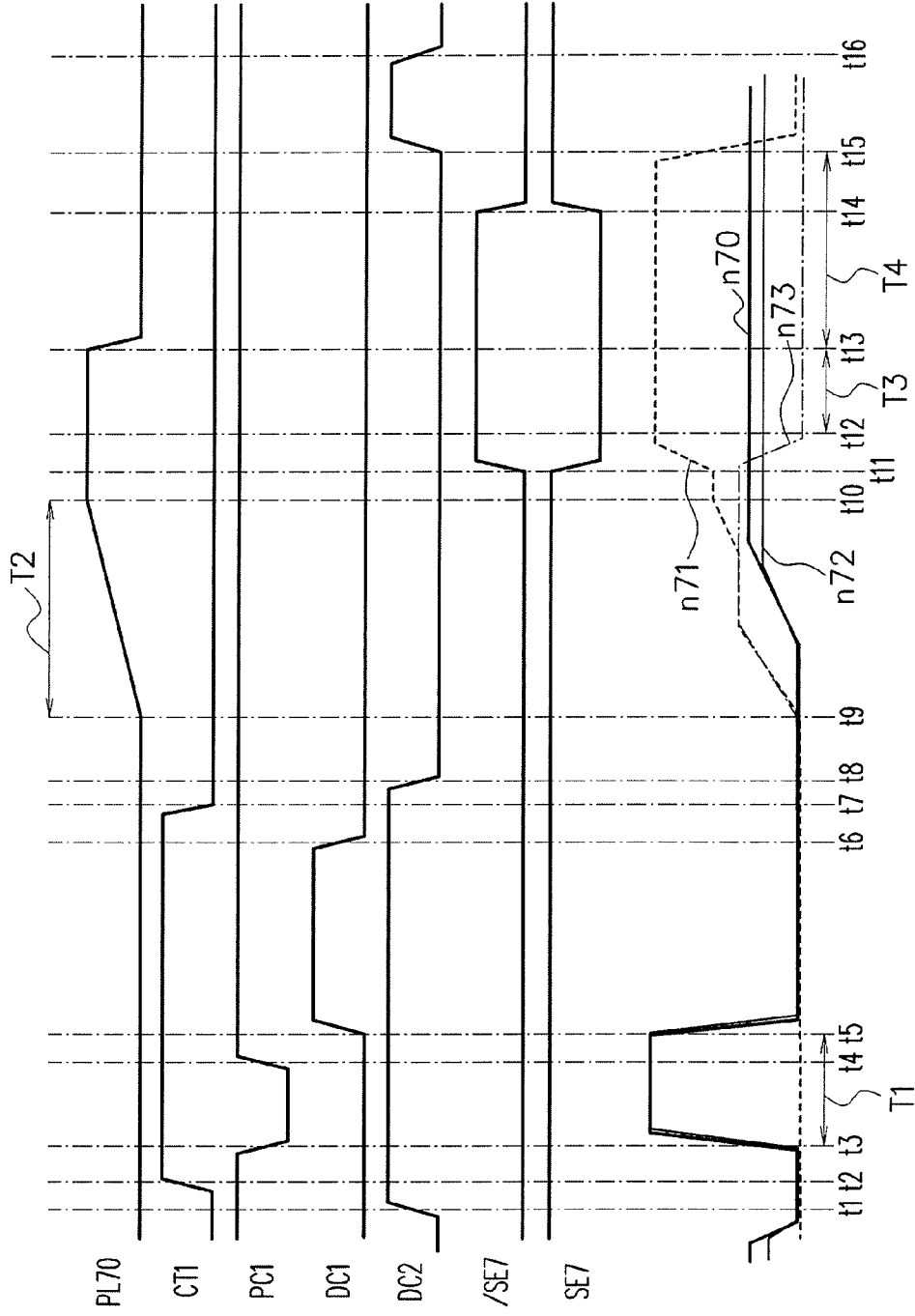
FIG. 5 is a voltage waveform diagram for explaining a read operation of the nonvolatile latch circuit in FIG. 4.

FIG. 4 is a circuit diagram illustrating a configuration example of a nonvolatile latch circuit according to a first embodiment, and FIG. 5 is a voltage waveform diagram for explaining a read operation of the nonvolatile latch circuit in FIG. 4. A first ferroelectric capacitor C71 has a first electrode connected to a plate line PL70 and a second electrode connected to a node n71. A p-channel field effect transistor P70 constitutes a source follower having a source connected to the node n71, a gate connected to a gate line CT1, and a drain connected to a node n70. A second ferroelectric capacitor C70 has a first electrode connected to the node n70 and a second electrode connected to a reference potential node (for example, a ground potential node). A p-channel field effect transistor P71 has a source connected to a power supply potential node, a gate connected to a gate line PC1, and a drain connected to the node n70. An n-channel field effect transistor N71 has a source connected to the reference potential node, a gate connected a gate line DC1, and a drain connected to the node n70. The bit line BL is connected to the node n71.

A third ferroelectric capacitor C73 has a first electrode connected to the plate line PL70 and a second electrode connected to a node n73. A p-channel field effect transistor P72 constitutes a source follower having a source connected to the node n73, a gate connected to the gate line CT1, and a drain connected to a node n72. A fourth ferroelectric capacitor C72 has a first electrode connected to the node n72 and a second electrode connected to the reference potential node. A p-channel field effect transistor P73 has a source connected to the power supply potential node, a gate connected to the gate line PC1, and a drain connected to the node n72. An n-channel field effect transistor N73 has a source connected to the reference potential node, a gate connected the gate line DC1, and a drain connected to the node n72. The bit line /BL is connected to the node n73.

The ferroelectric capacitors C70 to C73 have hysteresis characteristics of passing through the points 401 to 406 as illustrated in FIG. 3. The ferroelectric capacitors C71 and C73 store complementary information. For example, the ferroelectric capacitor C71 stores information of data "1" corresponding for the P-term state capacitor, and the ferroelectric capacitor C73 stores information of data "0" corresponding for the U-term state capacitor. The ferroelectric capacitors C70 and C72 are charge absorption parts for absorbing at least part of charges of the ferroelectric capacitors C71 and C73 respectively, and initialized to data "0" corresponding for the U-term state capacitor. The p-channel field effect transistor P70 is a charge transfer part for transferring charges from the first ferroelectric capacitor C71 to the second ferroelectric capacitor C70. The p-channel field effect transistor P72 is a charge transfer part for transferring charges from the third ferroelectric capacitor C73 to the fourth ferroelectric capacitor C72.

By the read operation in FIG. 5, the information stored in the ferroelectric capacitor C71 is read to the bit line BL and the information stored in the ferroelectric capacitor C73 is read to the bit line /BL.

A latch part 410 has p-channel field effect transistors P76, P77 and n-channel field effect transistors N76 to N79 and latch the data on the bit lines BL and /BL. The n-channel field effect transistor N78 has a drain connected to the bit line BL, a gate connected to a gate line DC2, and a source connected to the reference potential node. The n-channel field effect transistor N79 has a drain connected to the bit line /BL, a gate connected to the gate line DC2, and a source connected to the reference potential node. The p-channel field effect transistor P76 has a source connected to a power supply potential line /SE7, a gate connected to the bit line /BL, and a drain connected to the bit line BL. The p-channel field effect transistor P77 has a source connected to the power supply potential line /SE7, a gate connected to the bit line BL, and a drain connected to the bit line /BL. The n-channel field effect transistor N76 has a drain connected to the bit line BL, a gate connected to the bit line /BL, and a source connected to the power supply potential line SE7. The n-channel field effect transistor N77 has a drain connected to the bit line /BL, a gate connected to the bit line BL, and a source connected to the power supply potential line SE7.

The p-channel field effect transistors P70 and P72 constitute source followers, so that when the gate line CT1 is at 0 V, the nodes n71 and n73 are fixed to threshold voltages (for example, 0.6 V) of the transistors P70 and P72. The nodes n71 and n73 are fixed to 0.6 V, so that when the power supply voltage is 1.8 V, a voltage of 1.2 V (=1.8−0.6 V) is applied to the ferroelectric capacitors C71 and C73, that is, a voltage greater than the coercive voltage is applied to them, thus enabling operation even at a low power supply voltage of 1.8 V.

The amount of charge read from the ferroelectric capacitor C71 for the P-term state capacitor is greater than the amount of charge read from the ferroelectric capacitor C73 for the U-term state capacitor. To amplify and latch the potential difference between the nodes n71 and n72, the latch part 410 sets the capacitance values of the ferroelectric capacitors C70 and C72 for absorbing charges so as to absorb all of the charges of the ferroelectric capacitor C73 for the U-term state capacitor and not to absorb all of the charges of the ferroelectric capacitor C71 for the P-term state capacitor. For example, the capacitance values of the ferroelectric capacitors C70 and C72 are set to correspond to a capacitance value that is three times the capacitance value of the ferroelectric capacitor C73 for the U-term state capacitor.

When the ferroelectric capacitor C73 is for the U-term state capacitor, the potential of the node n73 becomes the threshold voltage of 0.6 V of the transistor P72, and the ferroelectric capacitor C72 is charged until the potential of the node n73 becomes 0.4 V. When the ferroelectric capacitor C71 is for the P-term state capacitor, the ferroelectric capacitor C70 is fully charged with the amount of overflow charge, so that the potential of the node n70 becomes the threshold voltage of 0.6 V of the transistor P70, and the potential of the node n71 becomes 0.9 V by the amount of overflow charge.

After the potentials of the nodes n71 and n73 become stable, the latch part 410 amplifies the potential difference between the nodes n71 and n73. The gate line PC1 is a signal line for initializing the ferroelectric capacitors C70 and C72 for the U-term state capacitor. The gate line DC1 is a signal line for setting the nodes n70 and n72 to the reference potential for absorbing charges after the aforementioned initialization and immediately before operation. The gate line DC2 is a signal line for deleting charge of the nodes n71 and n73 not derived from the read from the ferroelectric capacitors C71 and C73 immediately before the read.

Next, the read operation of the nonvolatile latch circuit in FIG. 4 will be explained referring to FIG. 5. The schematic flow includes writing the U-term state into the ferroelectric capacitors C70 and C72 (applying VDD to n70 and n72 so that the capacitors are at point 403 in FIG. 3 then back to GND and they are at point 404) in period T1, raising the plate line PL70 to high level in period T2, operating the latch part 410 by the lines SE7 and /SE7 at time t11, rewriting the U-term state into the ferroelectric capacitor C73 in period T3, and rewriting the P-term state into the ferroelectric capacitor C71 in period T4.

First, at time t1, the gate line DC2 is set to high level. Then, the transistors N78 and N79 are turned on, and the charges remaining at the nodes n71 and n73 are released to the reference potential node through the transistors N78 and N79 so that the nodes n71 and n73 are reset to 0 V. To prevent destruction of data in the ferroelectric capacitors C71 and C73 during the write of the U-term state into the ferroelectric capacitors C70 and C72 in period T1 after time t1, the nodes n71 and n73 need to be maintained at 0 V. Therefore, the gate line DC2 is maintained at high level from times t1 to t8.

Next, at time t2, the gate line CT1 is set to high level. Then, the transistors P70 and P72 are turned off so that the nodes n71 and n73 are disconnected from the nodes n70 and n72 respectively.

Next, during times t3 to t4, the gate line PC1 is maintained at low level. Then, the transistors P71 and P73 are turned on, and potentials of the nodes n70 and n72 become the power supply potential so that the U-term state is written into the ferroelectric capacitors C70 and C72.

The gate line PC1 is returned to high level at time t4, the gate line DC1 is maintained at high level during times t5 to t6 so that the transistors N71 and N73 are turned on to reset the nodes n70 and n72 to the reference potential. During times t4 to t5, a negative pulse of the gate line PC1 and a positive pulse of the gate line DC 1 are made not to overlap each other to prevent a through current.

Next, at time t6, the gate line DC 1 is set to low level to release the reset of the nodes n70 and n72 to the reference potential.

Next, at time t7, the gate line CT1 is set to low level. Then, the transistors P70 and P72 are turned on, but the gate line DC2 is maintained at high level in order to prevent gate coupling noise of the transistors P70 and P72.

Next, time t8, the gate line DC2 is set to low level to release the reset of the nodes n71 and n73 to the reference potential. The initialization setting ends at time t8.

Next, during times t9 to t10, the plate line PL70 is raised to high level to perform read. Note that period T2 is illustrated enlarged in the time axis direction to clarify the variation in potential of nodes n70 to n73 in FIG. 5.

First, the nodes n71 and n73 are raised in potential together with the plate line PL70 up to the threshold voltages of 0.6 V of the transistors P70 and P72. Thereafter, when the transistors P70 and P72 are turned on, the charge of the nodes n71 and n73 start to flow to the ferroelectric capacitors C70 and C72 respectively. Then, the potentials of the nodes n70 and n72 are raised, and the potentials of the nodes n71 and n73 stay constant The ferroelectric capacitor C73 is in the U-term state and has less charge to be read. In this case, the node n72 absorbs all of the charge at the voltage of 0.4 V before reaching the threshold voltage of 0.6 V of the transistor P72 and maintains the potential until the next reset. Since the potential of the gate line CT 1 of the transistor P72 constituting the source follower is 0 V, the potential of the node n73 does not exceed the threshold voltage of 0.6 V of the transistor P72 thus n73 is maintained at the threshold voltage of 0.6 V.

In contrast, the ferroelectric capacitor C71 is in the P-term state and has more charge to be read. In this case, the potential of the node n70 rises up to the threshold voltage of 0.6V of the transistor P70. However, when the rise in potential of the node n70 stops, the potential of the node n71 rises again to 0.9 V by the charge further outputted from the ferroelectric capacitor C71 because there is no more charge absorption occurring.

The above-described read from the ferroelectric capacitors C71 and C73 is data destruction read, and therefore rewrite of data needs to be performed in subsequent periods of T3 and T4.

Next, at time t10, the raising of the plate line P70 to high level is completed. Thereafter, at time t11, the reference potential line SE7 is set to low level and the power supply potential line /SE7 is set to high level to activate the latch part 410 to amplify the potential difference between the potential of 0.6 V at the node n73 and the potential 0.9 V at the node n71 to the power supply voltage amplitude.

Times t12 to t13 are period T3 when the plate line PL70 is at high level and the node n73 is at low level. In period T3, the U-term state is rewritten into the ferroelectric capacitor C73 by applying voltage point 403 in FIG. 3.

Times t13 to t15 are period T4 when the plate line PL70 is at low level and the node n71 is at high level. In period T4, the P-term state is rewritten into the ferroelectric capacitor C71 by applying voltage point 406 in FIG. 3.

Note that the latch part 410 is active only from time t11 to time t14 by the lines SE7 and /SE7, but the level at the node n71 is maintained, so that the P-term is rewritten into the ferroelectric capacitor C71 in period T4 until the gate line DC2 is set to high level and the node n71 is set to low level at time t15.

This makes it possible to apply a reading voltage of about 0.9 V to the ferroelectric capacitor C71 for the P-term reading, thereby doubling the reading voltage of 0.45 V in the case of the nonvolatile latch circuit in FIG. 1. The reading voltage of about 0.9 V is a voltage equal to or greater than the coercive voltage of 0.8 V, thus enabling stable read operation even at a low power supply voltage of 1.8 V.

As described above, the plate line PL70 is operated to cause the ferroelectric capacitor (charge absorption part) C70 to absorb at least part of charges outputted from the first ferroelectric capacitor C71 so as to suppress the variation in potential of the second electrode of the first ferroelectric capacitor C71 when reading information from the first ferroelectric capacitor C71 to the latch part 410. A plurality of sets of the ferroelectric capacitors C71, C73 and the charge absorption parts C70, C72 are provided corresponding to a plurality of complementary terminals of bit lines BL, /BL of the latch part 410.

Second Embodiment

FIG. 6 is a circuit diagram illustrating a configuration example of a nonvolatile latch circuit according to a second embodiment. A ferroelectric capacitor C71 corresponds to the ferroelectric capacitor C71 in FIG. 4 and has a first electrode connected to a plate line PL70 and a second electrode connected to a bit line BL. An n-channel field effect transistor N41 is a first transistor and is a charge absorption part corresponding to the ferroelectric capacitor C70 in FIG. 4. The n-channel field effect transistor N41 has a drain connected to the bit line BL and a source connected to a reference potential node. A first capacitor Cg1 has a first electrode connected to the bit line BL and a second electrode connected to a gate of the n-channel field effect transistor N41.

A ferroelectric capacitor Ct1 is a third ferroelectric capacitor and has a first electrode connected to a power supply potential node VDD and a second electrode connected to an output node Vn1. An n-channel field effect transistor N42 is a second transistor and has a drain connected to the output node Vn1 and a source connected to the reference potential node. A second capacitor Cg2 has a first electrode connected to the bit line BL and a second electrode connected to a gate of the n-channel field effect transistor N42.

A ferroelectric capacitor C73 corresponds to the ferroelectric capacitor C73 in FIG. 4 and has a first electrode connected to the plate line PL70 and a second electrode connected to a bit line /BL. An n-channel field effect transistor N43 is a charge absorption part corresponding to the ferroelectric capacitor C72 in FIG. 4. The n-channel field effect transistor N43 has a drain connected to the bit line /BL and a source connected to the reference potential node. A third capacitor Cg3 has a first electrode connected to the bit line /BL and a second electrode connected to a gate of the n-channel field effect transistor N43.

A ferroelectric capacitor Ct2 has a first electrode connected to the power supply potential node VDD and a second electrode connected to an output node Vn2. An n-channel field effect transistor N44 has a drain connected to the output node Vn2 and a source connected to the reference potential node. A fourth capacitor Cg4 has a first electrode connected to the bit line /BL and a second electrode connected to a gate of the n-channel field effect transistor N44.

The transistor N41 and the first capacitor Cg1 are the charge absorption part for absorbing at least part of charges of the ferroelectric capacitor C71. The transistor N43 and the third capacitor Cg3 are the charge absorption part for absorbing at least part of charges of the ferroelectric capacitor C73.

The transistor N42 and the second capacitor Cg2 are a current mirror part that draws a current resulting from mirroring a current of the transistor N41, from the second electrode of the ferroelectric capacitor Ct1. The transistor N44 and the fourth capacitor Cg4 are a current mirror part that draws a current resulting from mirroring a current of the transistor N43, from the second electrode of the ferroelectric capacitor Ct2.

A latch part 601 constitutes the same configuration as that of the latch part 410 in FIG. 4 and amplifies and latches the potential difference between the output nodes Vn1 and Vn2.

A plurality of sets of the ferroelectric capacitors C71, C73, the transistors (charge absorption parts) N41, N43, Cg1, Cg3, the ferroelectric capacitors Ct1, Ct2, and the current mirror parts N42, N44, Cg2, Cg4 are provided corresponding to a plurality of complementary terminals of output nodes Vn1 and Vn2 of the latch part 601.

Using the above-described current mirror parts, a nonvolatile latch circuit using no negative voltage is constituted. The capacitors Cg1 to Cg4 are bias capacitors for cancelling the threshold voltages of the transistors N41 to N44. Without the capacitors Cg1 to Cg4, a simple current mirror circuit is realized in which clamp of the threshold voltages of 0.6 V of the transistors N41, N43 are applied to the bit lines BL, /BL. At this time, in the case of the power supply voltage of 1.8 V, a voltage of about 1.8−0.6=1.2 V is applied to the ferroelectric capacitors C71 and C73.

In contrast, provision of the capacitors Cg1 to Cg4 and pre-charge of the capacitors Cg1 to Cg4 to the threshold voltages enables operation with the threshold voltages of the transistors N41, N43 set to virtually 0 V and full application of the power supply voltage of 1.8 V to the ferroelectric capacitors C71 and C73. This makes it possible to apply a voltage equal to or greater than the coercive voltage to the ferroelectric capacitors C71 and C73, thus enabling stable read operation even at a low power supply voltage of 1.8 V.

For example, the capacitance values of the ferroelectric capacitors Ct1 and Ct2 are set to correspond to a capacitance value that is three times the capacitance value of the ferroelectric capacitor C73 in the U-term 404. The pre-charged ferroelectric capacitors Ct1 and Ct2 are discharged through the transistors N42, N44. Currents obtained by integrating the discharge correspond to charges generated from the ferroelectric capacitors C71 and C73 respectively. The charges are converted into voltages, and the latch part 601 amplifies and latches the potential difference between the output nodes Vn1 and Vn2.

When the plate line PL70 is set to high level, a high voltage is outputted to the bit line BL since the ferroelectric capacitor C71 is in the P-term state, a large current (charge) flows through the transistor N42, and the potential of the output node Vn1 greatly decreases.

In contrast, when the plate line PL70 is set to high level, a low voltage is outputted to the bit line /BL since the ferroelectric capacitor C73 is in the U-term state, a small current (charge) flows through the transistor N44, and the potential of the output node Vn2 slightly decreases. The latch part 601 amplifies and latches the potential difference between the output nodes Vn1 and Vn2.

In this embodiment, the plate line PL70 is operated to cause the charge absorption part N41, Cg1 to absorb at least part of charges outputted from the ferroelectric capacitors C71 so as to suppress the variation in potential of the second electrode of the first ferroelectric capacitor C71 (ie. BL) when reading information from the first ferroelectric capacitor C71 to the latch part 601.

Figure 7A:
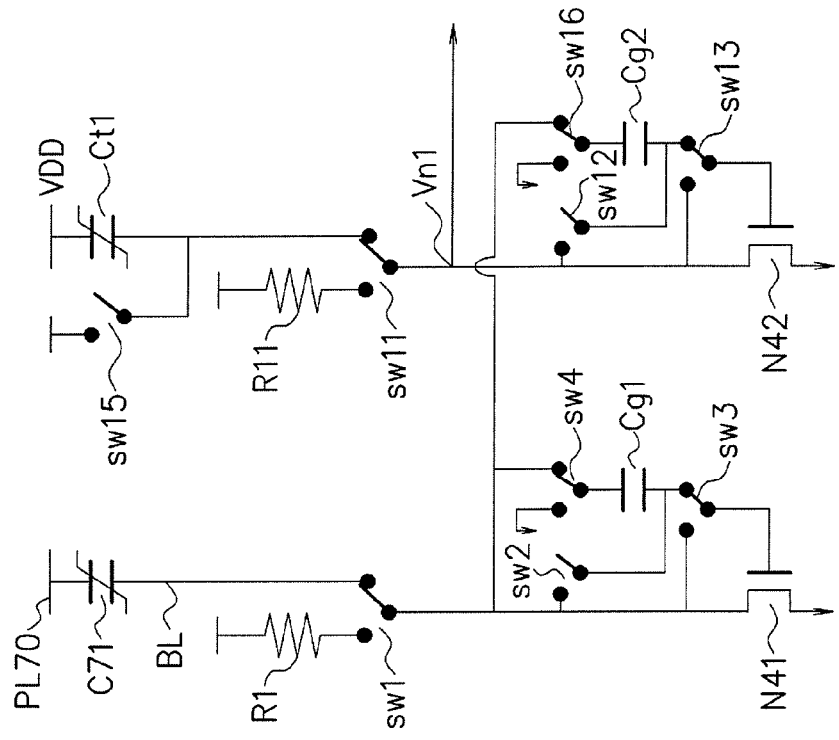
FIGS. 7A and 7B are circuit diagrams illustrating concrete pre-charging and amplifying configuration examples of part of the nonvolatile latch circuit in FIG. 6.
Figure 7B:
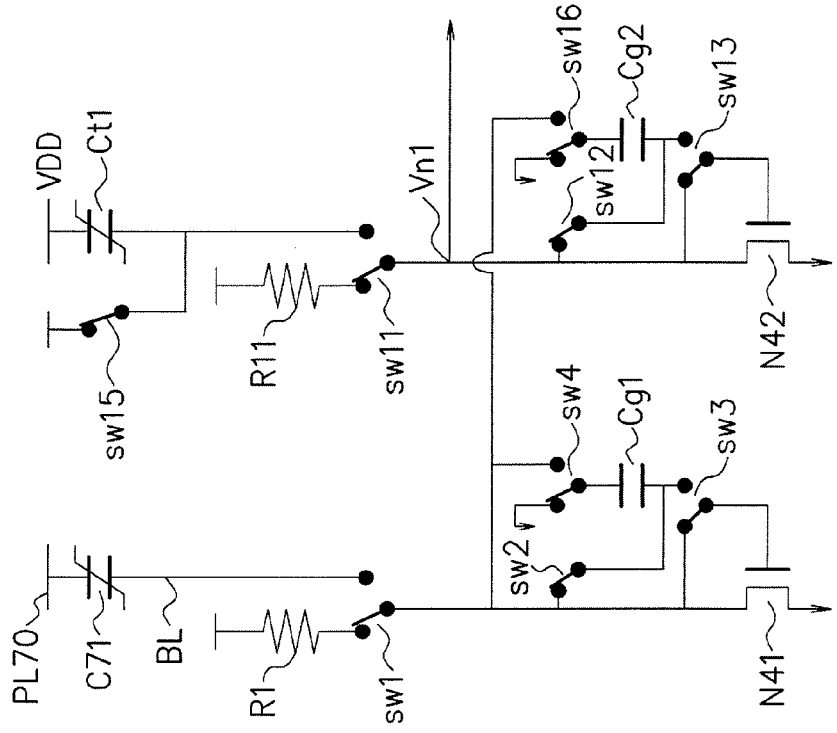

FIGS. 7A and 7B are circuit diagrams illustrating concrete configuration examples of a part of the nonvolatile latch circuit in FIG. 6. The other part is the same as those of the circuits in FIGS. 7A and 7B. Hereinafter, points of FIGS. 7A and 7B different from FIG. 6 will be explained. A switch sw1 is a switch for connecting the drain of the transistor N41 to the second electrode of the ferroelectric capacitor C71 or the power supply potential node VDD via a resistor R1. A switch sw2 is a switch for connecting or disconnecting the drain of the transistor N41 to/from the second electrode of the first capacitor Cg1. A switch sw3 is a switch for connecting the gate of the transistor N41 to the drain of the transistor N41 or the second electrode of the first capacitor Cg1. A switch sw4 is a switch for connecting the first electrode of the first capacitor Cg1 to the reference potential node or the drain of the transistor N41.

A switch sw11 is a switch for connecting the drain of the transistor N42 to the second electrode of the ferroelectric capacitor Ct1 or the power supply potential node VDD via a resistor R11. A switch sw12 is a switch for connecting or disconnecting the drain of the transistor N42 to/from the second electrode of the second capacitor Cg2. A switch sw13 is a switch for connecting the gate of the transistor N42 to the drain of the transistor N42 or the second electrode of the second capacitor Cg2. A switch sw15 is a switch for connecting or disconnecting the second electrode of the ferroelectric capacitor Ct1 to/from the power supply potential node VDD. A switch sw16 is a switch for connecting the first electrode of the second capacitor Cg2 to the reference potential node or the drain of the transistor N41.

First, pre-charge setting of the capacitors Cg1 and Cg2 in FIG. 7A is performed, and then read operation setting in FIG. 7B is performed.

First, in FIG. 7A, the drain of the transistor N41 is connected by the switch sw1 to the power supply potential node VDD via the resistor R1. Further, the second electrode of the first capacitor Cg1 is connected by the switched sw2 to the drain of the transistor N41. Further, the gate of the transistor N41 is connected by the switch sw3 to the drain of the transistor N41. Further, the first electrode of the first capacitor Cg1 is connected by the switch sw4 to the reference potential node. Further, the drain of the transistor N42 is connected by the switch sw11 to the power supply potential node VDD via the resistor R11. Further, the second electrode of the second capacitor Cg2 is connected by the switch sw12 to the drain of the transistor N42. Further, the gate of the transistor N42 is connected by the switch sw13 to the drain of the transistor N42. Further, the second electrode of the ferroelectric capacitor Ct1 is connected by the switch sw15 to the power supply potential node VDD. Further, the first electrode of the second capacitor Cg2 is connected by the switch sw16 to the reference potential node.

The transistors N41 and N42 are connected to the power supply potential node VDD via the resistors R1 and R11 respectively by diode connection. The transistors N41 and N42 have respective gates at their threshold voltages. The capacitors Cg1 and Cg2 are charged to the threshold voltages of the transistors N41 and N42 respectively. This allows the capacitors Cg1 and Cg2 to be charged with the threshold voltages of the transistors N41 and N42 respectively by self-correction.

The switch sw4 is a first switch and selectively connects the first electrode of the first capacitor Cg1 to the reference potential node or the second electrode of the ferroelectric capacitor C71. The switches sw2 and sw3 are a second switch that selectively connects the second electrode of the first capacitor Cg1 to a node at the threshold voltage (node at a voltage corresponding to the threshold value) of the drain of the transistor N41 or the gate of the transistor N41. Before the read of information from the ferroelectric capacitor C71 to the latch part 601, the first capacitor Cg1 is pre-charged with the voltage corresponding to the threshold value of the transistor N41.

The current mirror part has the second transistor N42, the second capacitor Cg2, and the switches sw11 to sw13, sw15, and sw16. The switch 16 is a third switch and selectively connects the first electrode of the second capacitor Cg2 to the reference potential node or the second electrode of the first ferroelectric capacitor C71. The switches sw12 and sw13 are a fourth switch that selectively connects the second electrode of the second capacitor Cg2 to a node at a voltage corresponding to the threshold value of the second transistor N42 or the gate of the second transistor N42. Before the read of information from the first ferroelectric capacitor C71 to the latch part 601, the second capacitor Cg2 is pre-charged with the voltage corresponding to the threshold value of the second transistor N42.

Next, in FIG. 7B, the drain of the transistor N41 is connected by the switch sw1 to the second electrode of the ferroelectric capacitor C71. Further, the second electrode of the first capacitor Cg1 is connected by the switches sw2 and sw3 to the gate of the transistor N41. Further, the first electrode of the first capacitor Cg1 is connected by the switch sw4 to the second electrode of the ferroelectric capacitor C71. Further, the drain of the transistor N42 is connected by the switch sw11 to the second electrode of the ferroelectric capacitor Ct1. Further, the second electrode of the second capacitor Cg2 is connected by the switches sw12 and sw13 to the gate of the transistor N42. Further, the second electrode of the ferroelectric capacitor Ct1 is disconnected by the switch sw15 from the power supply potential node VDD. Further, the first electrode of the second capacitor Cg2 is connected by the switch sw16 to the second electrode of the ferroelectric capacitor C71.

When the capacitors Cg1 and Cg2 are reversely connected to the gates of the transistors N41 and N42 respectively and the threshold voltages of the transistors N41 and N42 are Vth, a bias of −Vth is applied to the gates of the transistors N41 and N42 by the capacitors Cg1 and Cg2 respectively. In other words, this enables operation with effective threshold voltages of the transistors N41 and N42 set to 0 V. The effective threshold voltages Vth of the transistors N41 and N42 need to be accurately identical so that the current mirror has a perfect match, and an effect of self-correction of the threshold voltages Vth is expected.

The connection in FIG. 7B makes it possible to realize the same configuration as that in FIG. 6 and perform the same operation as that in FIG. 6 to read the information.

Third Embodiment

Figure 8:
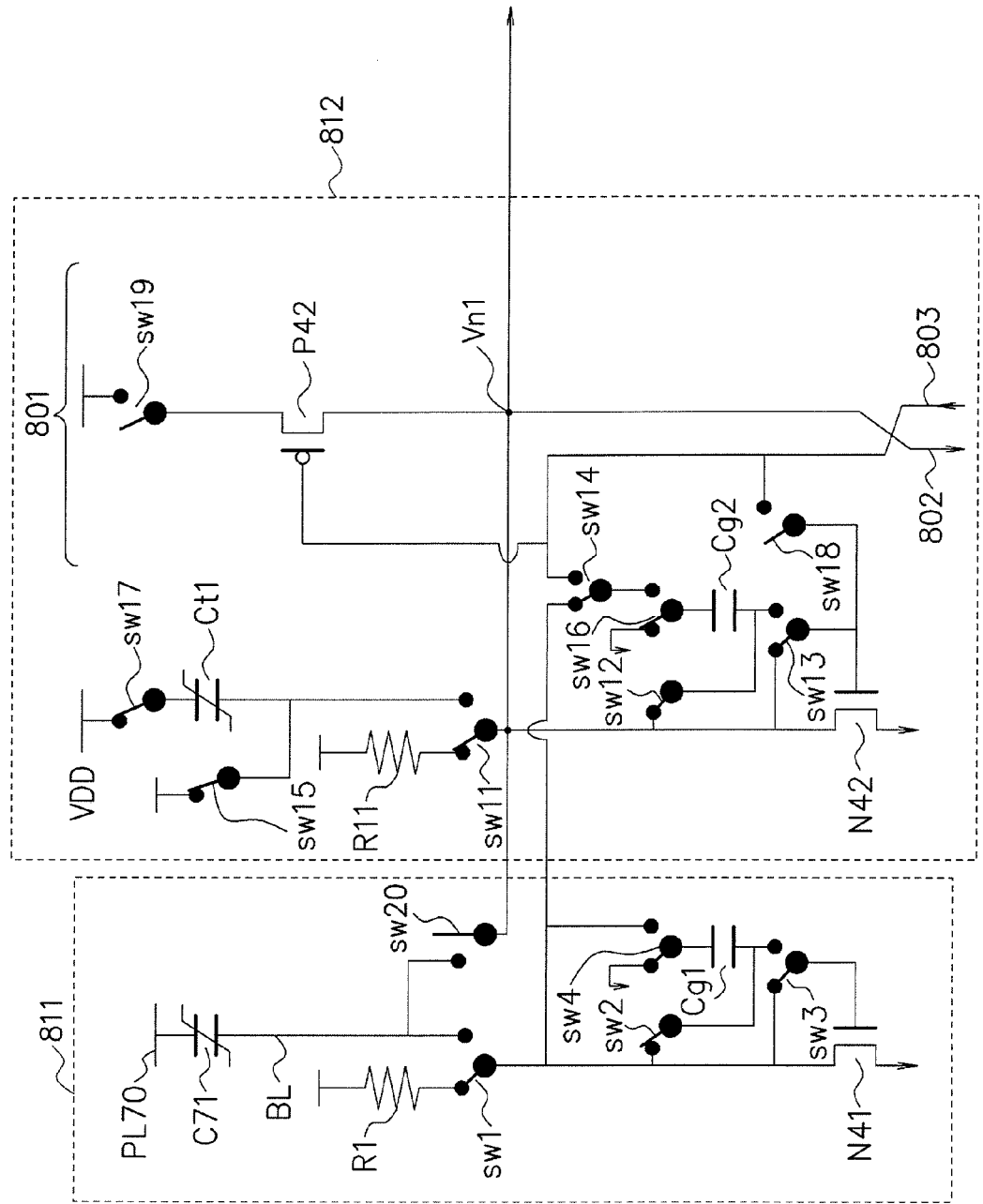
FIG. 8 is a circuit diagram illustrating a pre-charging configuration example of a nonvolatile latch circuit according to a third embodiment.

FIG. 8 is a circuit diagram illustrating a configuration example of a nonvolatile latch circuit according to a third embodiment. In this embodiment, the threshold voltage of the transistor N42 has been self-corrected according to the second embodiment and is therefore used for a latch part 801. More specifically, the latch part constitutes cross-coupling by Vn1 and Vn2 using the n-channel field effect transistors N42 and N44 (FIG. 6). Thus, the offset of the cross-coupling can also be cancelled. Hereinafter, the points of the circuit in FIG. 8 different from those in FIGS. 7A, 7B will be explained.

A switch sw20 is a switch for rewriting data into a ferroelectric capacitor C71 in period T3 or T4 in FIG. 5 and connects or disconnects a second electrode of the ferroelectric capacitor C71 to/from the output node Vn1. A switch sw17 connects or disconnects a power supply potential node VDD to/from a first electrode of a ferroelectric capacitor Ct1. A switch sw14 connects a first electrode of a second capacitor Cg2 connected thereto via a switch sw16 to a drain of the transistor N41 or a gate of a p-channel field effect transistor P42. A switch sw18 connects or disconnects a gate of the transistor N42 to/from the gate of the transistor P42.

The latch part 801 corresponds to the latch part 601 in FIG. 6 and has a switch sw19 and the p-channel field effect transistor (third transistor) P42. The switch sw19 connects or disconnects the power supply potential node VDD to/from a source of the transistor P42. A drain of the transistor P42 is connected to the output node Vn1. A line 802 is connected to the output node Vn1, and a line 803 is connected to the gate of the transistor P42. The lines 802 and 803 are connected to the capacitor Cg4 and the ferroelectric capacitor Ct2 in FIG. 6 as will be described later referring to FIG. 11.

The circuit in FIG. 8 is illustrated in a switch state of performing pre-charge operation of the capacitors Cg1 and Cg2 as in FIG. 7A. Hereinafter, the points of the switches different from the switches in FIG. 7A will be explained. The switch sw20 disconnects the second electrode of the ferroelectric capacitor C71 from the output node Vn1. The switch sw17 connects the power supply potential node VDD to the first electrode of the ferroelectric capacitor Ct1. A switch sw15 connects the power supply potential node VDD to a second electrode of the ferroelectric capacitor Ct1. The switch sw14 is connected to the drain of the transistor N41. The switch sw18 disconnects the gate of the transistor N42 from the gate of the transistor P42. The switch sw19 disconnects the power supply potential node VDD from the source of the transistor P42. By these states of the switches, the capacitors Cg1 and Cg2 can be pre-charged with threshold voltages Vth of the transistors N41 and N42 as in FIG. 7A.

Figure 9:
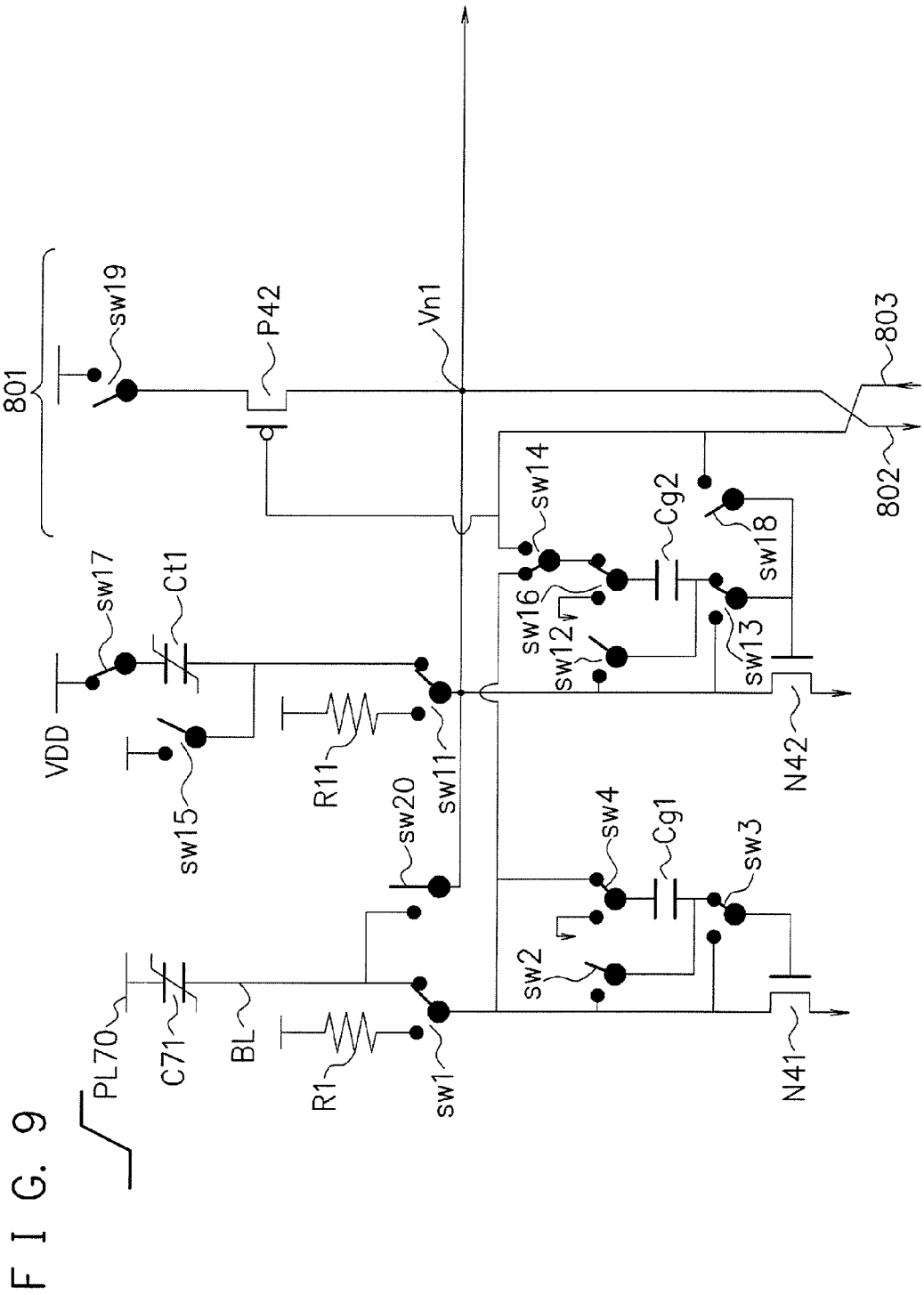
FIG. 9 is a circuit diagram illustrating a amplifying configuration example of the nonvolatile latch circuit according to the third embodiment.

Next, the switch state illustrated in FIG. 9 is set to raise the plate line PL70 to high level as with time t9 in FIG. 5 to read and integrate charges. A switch sw1 connects the drain of the transistor N41 to the second electrode of the ferroelectric capacitor C71. A switch sw2 disconnects the drain of the transistor N41 from the second electrode of the first capacitor Cg1. A switch sw4 connects the drain of the transistor N41 to the first electrode of the first capacitor Cg1. A switch sw3 connects the second electrode of the first capacitor Cg1 to the gate of the transistor N41. The switch sw15 disconnects the power supply potential node VDD from the second electrode of the ferroelectric capacitor Ct1. A switch sw11 connects the drain of the transistor N42 to the second electrode of the ferroelectric capacitor Ct1. A switch sw12 disconnects the drain of the transistor N42 from the second electrode of the second capacitor Cg2. The switch sw16 connects the first electrode of the second capacitor Cg2 to the drain of the transistor N41 via the switch sw14. A switch sw13 connects the gate of the transistor N42 to the second electrode of the second capacitor Cg2. By these states of the switches, the same operation as with time t9 in FIG. 5 is performed. The states of the switches sw17, sw18, sw19, and sw20 are the same as those in FIG. 8.

Figure 10:
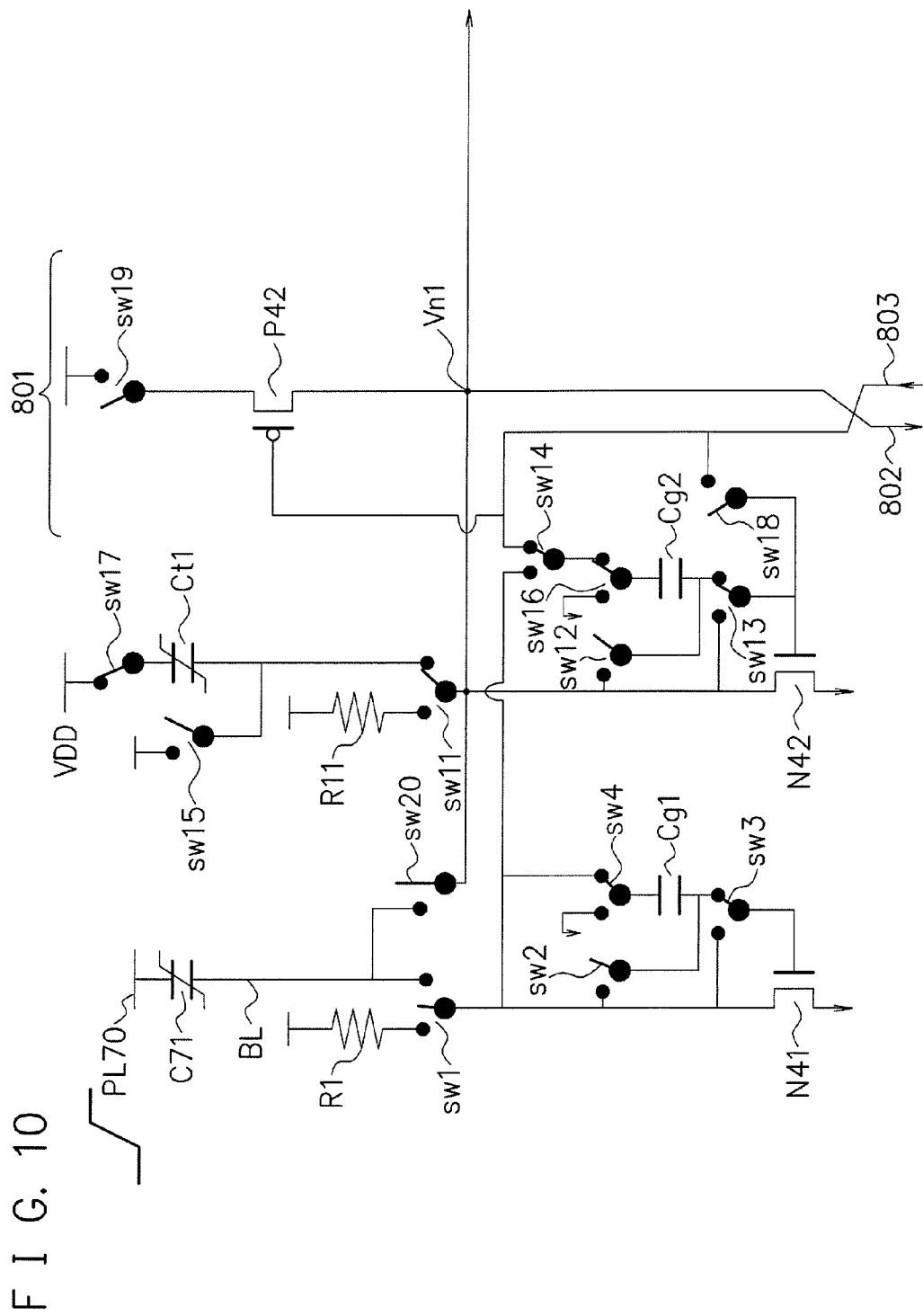
FIG. 10 is a circuit diagram illustrating a 1st step latching configuration example of the nonvolatile latch circuit according to the third embodiment.

Next, the switch state illustrated in FIG. 10 is set to activate the n-channel field effect transistor N42 constituting the cross-coupling of the latch part. The switch sw1 disconnects the drain of the transistor N41 from the ferroelectric capacitor C71 and a resistor R1. The switch sw14 connects the gate (namely, the line 803 that is the partner of the cross-coupling) of the transistor P42 to the first electrode of the second capacitor Cg2 via the switch sw16.

FIG. 11 corresponds to FIG. 10 and FIG. 6 and is a circuit diagram illustrating a configuration example of the cross-coupling of the latch part. The latch part 801 has a switch sw21 and a p-channel field effect transistor P44 in addition to the switch sw19 and the transistor P42 in FIG. 10. The cross-coupling of the latch part has the p-channel field effect transistors P42, P44 and the n-channel field effect transistors N42, N44. The switch sw21 connects or disconnects the power supply potential node VDD to/from a source of the transistor P44. The transistor P44 has a gate connected to the first electrode of the fourth capacitor Cg4 and a drain connected to the output node Vn2. The output node Vn1 is connected to the first electrode of the fourth capacitor Cg4. The gate of the transistor P42 is connected to the second electrode of the ferroelectric capacitor Ct2 ie. Vn2.

Since the threshold voltages of the transistors N42 and N44 have been self-compensated to 0 V by the capacitors Cg2 and Cg4, the latch part constitutes cross-coupling using the self-compensated Vt transistors N42 and N44. Thus, the offset of the cross-coupling can also be cancelled. If the potential difference has been amplified up to the offset or more of the cross-coupling of the p-channel field effect transistors P42, P44 by the cross-coupling of the n-channel field effect transistors N42 and N44, compensation of the threshold voltages of the p-channel field effect transistors P42 and P44 is not necessary.

Next, the switch state illustrated in FIG. 12 is set to activate the p-channel field effect transistors P42 and P44 constituting the cross-coupling of the latch part. The switch sw11 disconnects the drain of the transistor N42 from the ferroelectric capacitor Ct1 and the resistor R11. The switch sw14 disconnects the first electrode of the second capacitor Cg2 from the gate of the transistor P42. The switch sw18 connects the gate of the transistor N42 to the gate of the transistor P42. The switch sw19 connects the power supply potential node VDD to the source of the transistor P42. Thus, the threshold voltage Vth of the n-channel field effect transistor N42 seen from the line 803 returns from a state of effectively 0 V due to correction by the capacitor Cg2 to a normal state of 0.6 V without correction by the capacitor Cg2. This results in the latch part 801 in a latch state with less off-leakage current through the n-channel field effect transistor N42.

Figure 13:
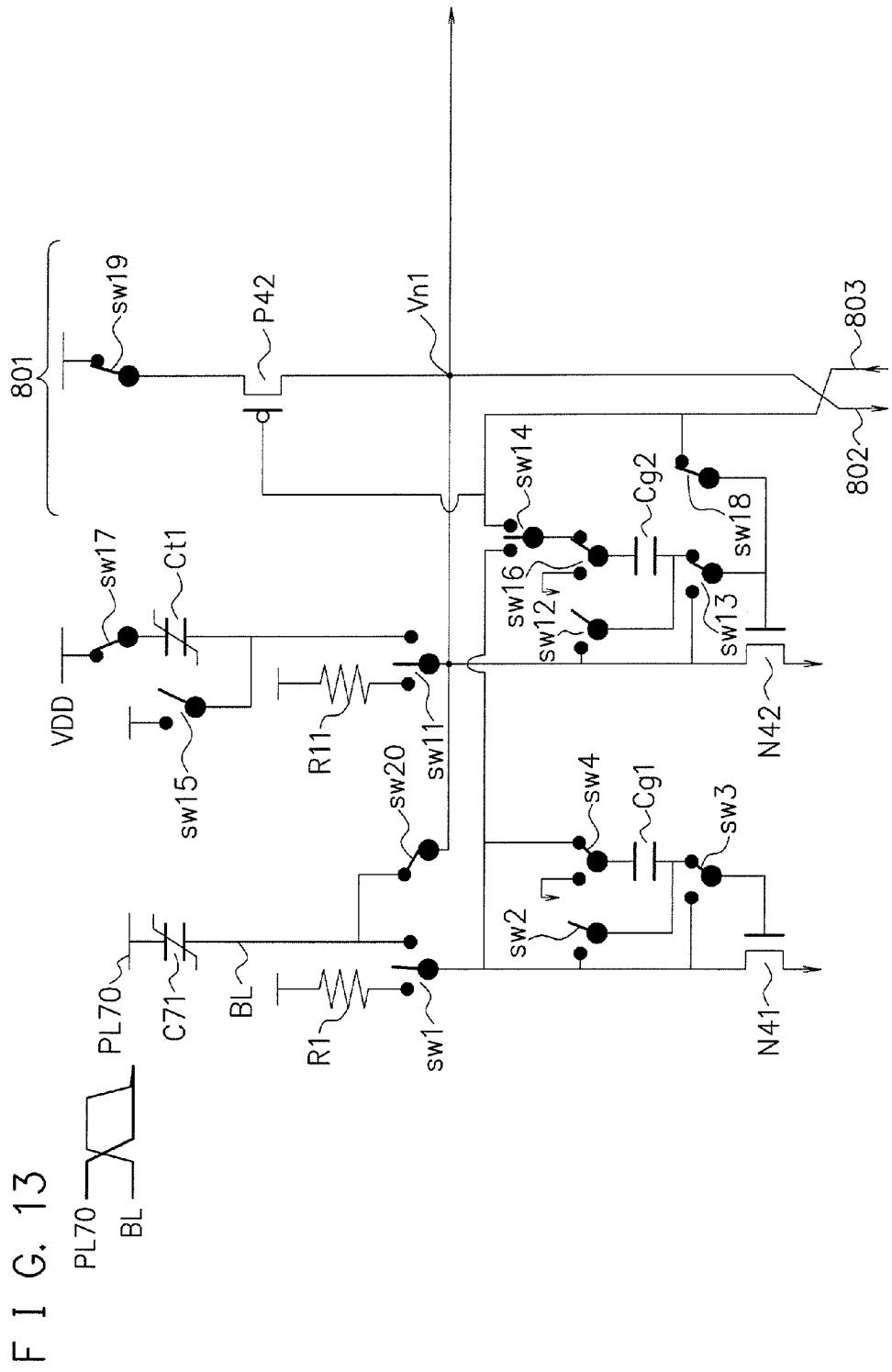
FIG. 13 is a circuit diagram illustrating a write-back configuration example of the nonvolatile latch circuit according to the third embodiment.

Next, after the latch amplitude of Vn1 and Vn2 has reached CMOS full swing and the voltage of the plate line PL70 is lowered as with time t13 in FIG. 5, the switch state illustrated in FIG. 13 is set to rewrite the P-term state into the ferroelectric capacitor C71. The switch sw20 connects the second electrode of the ferroelectric capacitor C71 to the output node Vn1.

According to this embodiment, the latch part 801 has the p-channel field effect transistors P42 and P44 and performs latch using the n-channel field effect transistors N42 and N44. Since the n-channel transistors N42 and N44 have been Vth self-compensated, the offset of the cross-coupling of the latch part can also be cancelled at the beginning of a small signal amplifying. Then P42, P44, N42, and N44 CMOS cross couple latch is enabled without Vt compensation starting with sufficient signal amplitude larger than Vt variation.

Figures 14A, 14B, 14C:
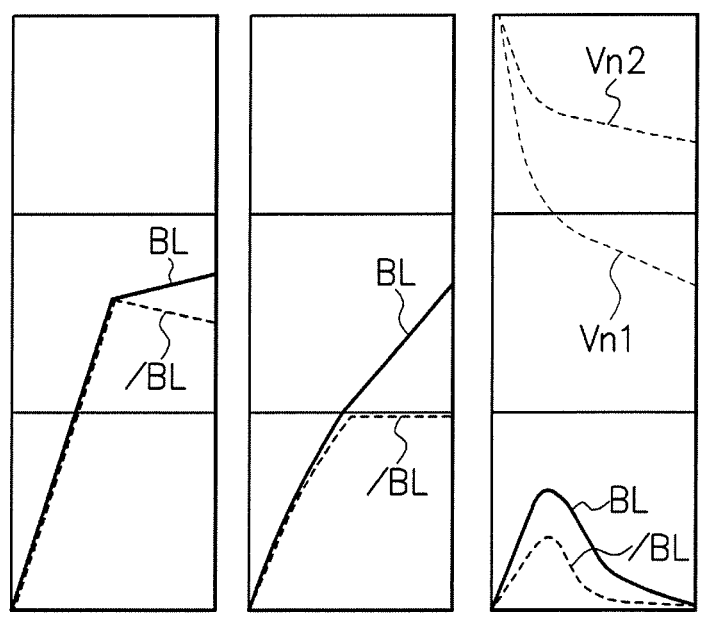
FIGS. 14A to 14C are voltage waveform diagrams for explaining effects of the first and second embodiments.

FIGS. 14A to 14C are voltage waveform diagrams for explaining effects of the first and second embodiments.

FIG. 14A illustrates the voltage waveforms at the bit lines BL and /BL of the nonvolatile latch circuit in FIG. 1. When the power supply voltage is 1.8 V, only 0.45 V (=1.8/4 V) is applied to the ferroelectric capacitor C13 in the P-term state. Thus, only a voltage less than the coercive voltage is applied to it, and the potential difference between the bit lines BL and /BL is therefore comparatively small, leading to difficulty of stable read.

FIG. 14B illustrates the voltage waveforms at the bit lines BL and /BL of the nonvolatile latch circuit of the first embodiment (FIG. 4). When the power supply voltage is 1.8 V, a voltage of 1.2 V (=1.8-0.6 V) is applied to the ferroelectric capacitors C71 and C73. Thus, a voltage equal to or greater than the coercive voltage is applied to them, and the potential difference between the bit lines BL and /BL is therefore comparatively large, leading to possibility of stable read even at the low power supply voltage of 1.8 V. The latch part 410 amplifies the potential difference between the bit lines BL and /BL to improve the reliability.

FIG. 14C illustrates the voltage waveforms at the bit lines BL and /BL and the output nodes Vn1, Vn2 of the nonvolatile latch circuit of the second embodiment (FIG. 6). When the power supply voltage is 1.8 V, the power supply voltage of 1.8 V can be fully applied to the ferroelectric capacitors C71 and C73. Thus, a voltage greater than the coercive voltage can be applied to the ferroelectric capacitors C71 and C73, and the potential difference between the output nodes Vn1 and Vn2 is therefore comparatively large, leading to possibility of stable read even at the low power supply voltage of 1.8 V. The latch part 601 amplifies the potential difference between the output nodes Vn1 and Vn2 to improve the reliability.

According to the first to third embodiments, information can be read from a ferroelectric capacitor by applying a high voltage to the ferroelectric capacitor, so that the read operation can be stably performed even at a low power supply voltage.

Fourth Embodiment

FIG. 15 is a diagram illustrating a configuration example of a ferroelectric memory device according to a fourth embodiment. An inverter 108 outputs a logical inversion signal of an inverted write enable signal /WE as an internal write enable signal intWE to input/output buffers 106 and 107. A negative logical sum (NOR) circuit 109 outputs a negative logical sum signal of the internal write enable signal intWE and an inverted output enable signal /OE as an internal output enable signal intOE to the input/output buffers 106 and 107. A negative logical product (NAND) circuit 110 outputs a negative logical product signal of the inverted write enable signal /WE and the inverted output enable signal /OE. A negative logical product circuit 111 outputs a negative logical product signal of an inverted lower byte select signal /LB and an inverted upper byte select signal /UB. A logical product (AND) circuit 112 outputs a logical product signal of the output signal of the negative logical product circuit 110 and a logical inversion signal of a first inverted chip select signal /CS1. A logical product circuit 113 outputs a logical product signal of the output signal of the logical product circuit 112 and the output signal of the negative logical product circuit 111. A logical product circuit 114 outputs a logical product signal of the output signal of the logical product circuit 113 and a second chip select signal CS2 to an address latch 101 and the input/output buffers 106, 107. A negative logical sum (NOR) circuit 115 outputs a negative logical sum signal of a logical inversion signal of the output signal of the logical product circuit 113 and the inverted lower byte select signal /LB to the lower byte input/output buffer 106. A negative logical sum circuit 116 outputs a negative logical sum signal of the logical inversion signal of the output signal of the logical product circuit 113 and the inverted upper byte select signal /UB to the upper byte input/output buffer 107.

The address latch 101 latches addresses A0 to A17 and outputs them to a row decoder 102 and a column decoder 104. The address A0 to A17 includes row addresses and column addresses. The lower byte input/output buffer 106 receives and outputs lower byte data DT1 to DT8 from/to the outside. The upper byte input/output buffer 107 receives and outputs upper byte data DT9 to DT16 from/to the outside. Specifically, the input/output buffers 106 and 107 receive the data DT1 to DT16 to be written to a memory cell array 103 and output the data DT1 to DT16 read from the memory cell array 103.

The memory cell array 103 has a plurality of ferroelectric memory cells arranged in a two-dimensional matrix form and stores data of respective addresses. Each of the ferroelectric memory cells is identified by selecting a word line and a bit line. The row decoder 102 selects a word line corresponding to a row address. The column decoder 104 selects a bit line corresponding to a column address. A sense amplifier 105 amplifies data inputted from the input/output buffers 106, 107 and outputs the amplified data to the memory cell array 103 via the column decoder 104. When a write cycle is applied, data is written in the ferroelectric memory cell of the selected word line and bit line in the memory cell array 103. Further, when a read cycle is applied, data is read from the ferroelectric memory cells of the selected word line and bit line in the memory cell array 103. The sense amplifier 105 amplifies the read data and outputs the amplified data to the input/output buffers 106 and 107.

The above-described nonvolatile latch circuit in FIG. 6 can be applied for the ferroelectric memory device in FIG. 15. In the circuit of FIG. 6, the ferroelectric capacitors C71 and C73 are provided in the memory cell array 103 in FIG. 15 and the other elements are provided in the sense amplifier 105 in FIG. 15. Note that there are actually provided transistors 2101 to 2103 (FIG. 21) for selecting the ferroelectric capacitors C71 and C73 by the word line in FIG. 15. The transistors 2101 to 2103 will be explained later referring to FIG. 21.

Figures 16A, 16B:
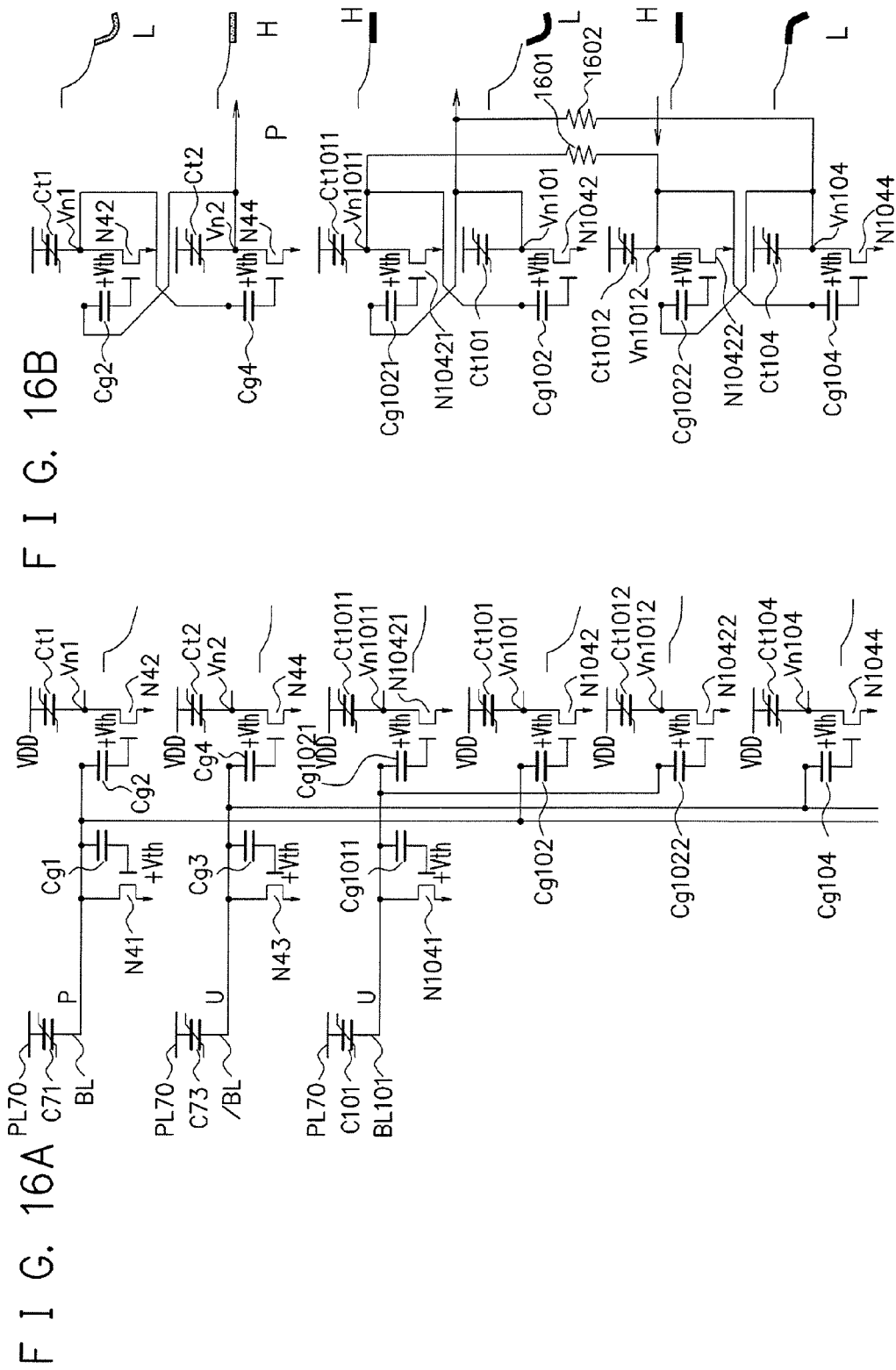
FIGS. 16A and 16B are diagrams illustrating amplifying and 1st step latching configuration examples of part of a memory cell array and a sense amplifier in FIG. 15 for reading U-term bit of a 1T1C cell.

FIG. 16A is a diagram illustrating a configuration example of part of the memory cell array 103 and the sense amplifier 105 in FIG. 15 and corresponds to the above-described circuit in FIG. 6. FIG. 16A is a diagram corresponding to the above-described integration operation in FIG. 9, FIG. 16B is a diagram illustrating the latch operation by the cross-coupling of the above-described n-channel field effect transistor in FIG. 11, and FIG. 17 is a diagram illustrating the latch operation by the cross-coupling of the above-described n-channel and p-channel field effect transistors in FIG. 12.

Hereinafter, the points of the circuit in FIG. 16A different from the circuit in FIG. 6 will be explained. The ferroelectric capacitors 071, C73 and C101 are provided in the memory cell array 103 in FIG. 15, and the other elements are provided in the sense amplifier 105 in FIG. 15. As in FIG. 6, for example, the ferroelectric capacitor C71 stores information of data "1" corresponding to the P-term state, and the ferroelectric capacitor C73 stores information of data "0" corresponding to the U-term state. The ferroelectric capacitors C71 and C73 store complementary information and also serves as reference voltage generating for other single capacitor data cells, and the byte wide operation can include information of 1 bit thereby in the memory cell array 103. In this case, since the ferroelectric capacitor C71 is in the P-term state, a high voltage is outputted to the bit line BL as described above, a large current flows through the transistors N41 and N42, then the potential of the output node Vn1 greatly decreases. In contrast, since the ferroelectric capacitor C73 is in the U-term state, a low voltage is outputted to the bit line /BL, a small current flows through the transistors N43 and N44, then the potential of the output node Vn2 slightly decreases.

Next, as illustrated in FIG. 16B on the top, the potential of the output node Vn1 is latched at low level and the potential of the output node Vn2 is latched at high level by the latch operation by the cross-coupling of the n-channel field effect transistors N42 and N44 as is in FIG. 11.

Next, as illustrated in FIG. 17 on the top, the potential of the output node Vn1 is latched at complete low level and the potential of the output node Vn2 is latched at complete high level by the latch operation by the cross-coupling of the p-channel field effect transistors P42, P44 and the n-channel field effect transistors N42, N44 as is 801 in FIG. 12. Here, the high level at the output node Vn2 is outputted corresponding to C71 and C71 data, as one of the output signals of the sense amplifier 105 in FIG. 15. When the data "1" corresponding to the P-term state is stored in the ferroelectric capacitor C71 and U-term state is stored in the ferroelectric capacitor C73 as complementary storage, the output node Vn2 outputs high level. In contrast, when the data "0" corresponding to the U-term state is stored in the ferroelectric capacitor C71 and P-term state is stored in the ferroelectric capacitor C73 as complementary storage, the output node Vn2 outputs low level. Thus, the data stored in the ferroelectric capacitor C71 and complementary capacitor C73 can be read.

Next, read operation of the ferroelectric capacitor C101 will be described referring to FIG. 16A. The ferroelectric capacitor C101 is a ferroelectric capacitor in a single capacitor memory cell and uses the above-described ferroelectric capacitors C71 and C73 as ferroelectric capacitors for reference revel generating cells. The ferroelectric capacitor C101 can store data of 1 bit among the byte wide. Hereinafter, a read method of the ferroelectric capacitor C101 will be explained.

A circuit group of the ferroelectric capacitor C101 has the same configuration as that of the circuit group of the above-described ferroelectric capacitor C71. The ferroelectric capacitor C101 is seen corresponding to the ferroelectric capacitor C71 and has a first electrode connected to the PL line 70 and a second electrode connected to a bit line BL101. An n-channel field effect transistor N1041 is seen corresponding to the transistor N41 and has a drain connected to the bit line BL101 of the ferroelectric capacitor C101 and a source connected to the power supply potential node. A capacitor Cg1011 is seen corresponding to the capacitor Cg1 and is connected between the bit line BL101 of the ferroelectric capacitor C101 and the gate of the transistor N1041. An n-channel field effect transistor N10421 is seen corresponding to the transistor N42 and has a drain connected to an output node Vn1011 and a source connected to the power supply potential node. A capacitor Cg1021 is seen corresponding to the capacitor Cg2 and is connected between the bit line BL101 of the ferroelectric capacitor C101 and the gate of the transistor N10421. A ferroelectric capacitor Ct1011 is seen corresponding to the ferroelectric capacitor Ct1 and has a first electrode connected to the power supply potential node VDD and a second electrode connected to the output node Vn1011. The transistor N10421 is a current mirror part and draws a current resulting from mirroring a current of the transistor N1041, from the second electrode of the ferroelectric capacitor Ct1011. The ferroelectric capacitor C101 stores, for assuming, information of data "0" corresponding to the U-term state in the FIG. 16A. Since the ferroelectric capacitor C101 is assumed to be in the U-term state like the ferroelectric capacitor C73, a low voltage is outputted to the bit line BL101, a small current flows through the transistors N1041 and N10421, then the potential of the output node Vn1011 slightly decreases.

Further, a capacitor Cg1022 is connected to the bit line BL101 of the ferroelectric capacitor C101. The capacitor Cg1022 is seen corresponding to the capacitor Cg1021 and is connected between the bit line BL101 of the ferroelectric capacitor C101 and the gate of an n-channel field effect transistor N10422. The n-channel field effect transistor N10422 is seen corresponding to the transistor N10421 and has a drain connected to the output node Vn1012 and a source connected to the reference potential node. A ferroelectric capacitor Ct1012 is seen corresponding to the ferroelectric capacitor Ct1011 and is connected between the power supply potential node VDD and the output node Vn1012. Since the ferroelectric capacitor C101 is assumed to be in the U-term state, a low voltage is outputted to the bit line BL101, a small current flows through the transistors N1041 and N10422, then the potential of the output node Vn1012 slightly decreases as identical to the output node Vn1011.

Further, a capacitor Cg102 is connected to the bit line BL of the ferroelectric capacitor C71. The capacitor Cg102 is seen corresponding to the capacitor Cg2 and is connected between the bit line BL of the ferroelectric capacitor C71 and the gate of an n-channel field effect transistor N1042. The n-channel field effect transistor N1042 is seen corresponding to the transistor N42 and has a drain connected to the output node Vn101 and a source connected to the reference potential node. The ferroelectric capacitor Ct101 is seen corresponding to the ferroelectric capacitor Ct1 and is connected between the power supply potential node VDD and the output node Vn101. The transistor N1042 is a current mirror part and draws a current resulting from mirroring a current of the transistor N41, from the ferroelectric capacitor Ct101. Since the ferroelectric capacitor C71 is in the P-term state, a high voltage is outputted to the bit line BL, a large current flows through the transistors N41 and N1042, then the potential of the output node Vn101 greatly decreases as identical to the output node Vn1.

Further, a capacitor Cg104 is connected to the bit line /BL of the ferroelectric capacitor C73. The capacitor Cg104 is seen corresponding to the capacitor Cg4 and is connected between the bit line /BL of the ferroelectric capacitor C73 and the gate of an n-channel field effect transistor N1044. The n-channel field effect transistor N1044 is seen corresponding to the transistor N44 and has a drain connected to the output node Vn104 and a source connected to the reference potential node. The ferroelectric capacitor Ct104 is seen corresponding to the ferroelectric capacitor Ct2 and is connected between the power supply potential node VDD and the output node Vn104. Since the ferroelectric capacitor C73 is in the U-term state, a low voltage is outputted to the bit line /BL, a small current flows through the transistors N43 and N1044, then the potential of the output node Vn104 slightly decreases as identical with the output node Vn2.

Next, as illustrated in FIG. 16B, the n-channel field effect transistors N10421, N1042, the capacitors Cg1021, Cg102, and the ferroelectric capacitors Ct1011, Ct101 are controlled to have the same connection as the above-described connection of the n-channel field effect transistors N42, N44, the capacitors Cg2, Cg4, and the ferroelectric capacitors Ct1, Ct2 as is in FIG. 11.

Further, the n-channel field effect transistors N10422, N1044, the capacitors Cg1022, Cg104, and the ferroelectric capacitors Ct1012, Ct104 are controlled to have the same connection as the above-described connection of the n-channel field effect transistors N42, N44, the capacitors Cg2, Cg4, and the ferroelectric capacitors Ct1, Ct2.

Further, a resistor 1601 is connected between the output notes Vn1011 and Vn1012. A resistor 1602 is connected between the output nodes Vn101 and Vn104.

The potential of the output node Vn1011 is latched at a high level and the potential of the output node Vn101 is latched at low level (0 V) by the latch operation by the cross-coupling of the n-channel field effect transistors N10421 and N1042 with virtual Vt of 0 V. On the contrary, the potential of the output node Vn1012 and Vn104 are almost same thus they goes to a meta stable at the beginning of the latch operation and their potential level stays same by the latch operation by the cross-coupling of the n-channel field effect transistors N10422 and N1044 with virtual Vt compensated to 0 V.

Further, the output node Vn104 is connected to the output node Vn101 via the resistor 1602 and therefore lowers in potential after the latch N1042 and N10421 amplify and drives Vn101 to low. As a result, eventually the potential of the output node Vn1012 is latched at a high level and the potential of the output node Vn104 is latched at a low level by the latch operation by the cross-coupling of the n-channel field effect transistors N10422 and N1044.

Next, as illustrated in FIG. 17, the p-channel field effect transistors P1011, P101, and the n-channel field effect transistors N10421, N1042 are controlled to have the same connection as the above-described connection of the p-channel field effect transistors P42, P44, and the n-channel field effect transistors N42, N44 as is in FIG. 12.

Further, the p-channel field effect transistors P1012, P104, and the n-channel field effect transistors N10422, N1044 are controlled to have the same connection as the above-described connection of the p-channel field effect transistors P42, P44, and the n-channel field effect transistors N42, N44. Note that in this full CMOS latch period, n-channel field effect transistors are operated to have normal Vt without inserting offset capacitors Cg's.

The potential of the output node Vn1011 is latched at complete high level and the potential of the output node Vn101 is latched at complete low level by the latch operation by the cross-coupling of the p-channel field effect transistors P1011, P101 and the n-channel field effect transistors N10421 and N1042.

Further, the potential of the output node Vn1012 is latched at complete high level and the potential of the output node Vn104 is latched at complete low level by the latch operation by the cross-coupling of the p-channel field effect transistors P1012, P104 and the n-channel field effect transistors N10422 and N1044.

Here, the low level at the output node Vn101 is outputted as the output signal of the sense amplifier 105 in FIG. 15. When the data "0" corresponding to the U-term state is stored in the ferroelectric capacitor C101, the low level is outputted from the output node Vn101. Thus, the data "0" stored in the one ferroelectric capacitor C101 cell can be read.

As described above, the sense amplifier 105 amplifies and holds the charges transferred from the ferroelectric capacitor C101 of the selected one capacitor memory cell based on the charges of the reference generating cells C71 and C73.

Hereinbefore, the case where the data "0" corresponding to the U-term state is stored in the single ferroelectric capacitor C101 cell has been explained referring to FIGS. 16A, 16B and FIG. 17. Next, the case where the data "1" corresponding to the P-term state is stored in the single ferroelectric capacitor C101 cell will be explained referring to FIGS. 18A, 18B and FIG. 19.

Figure 18:
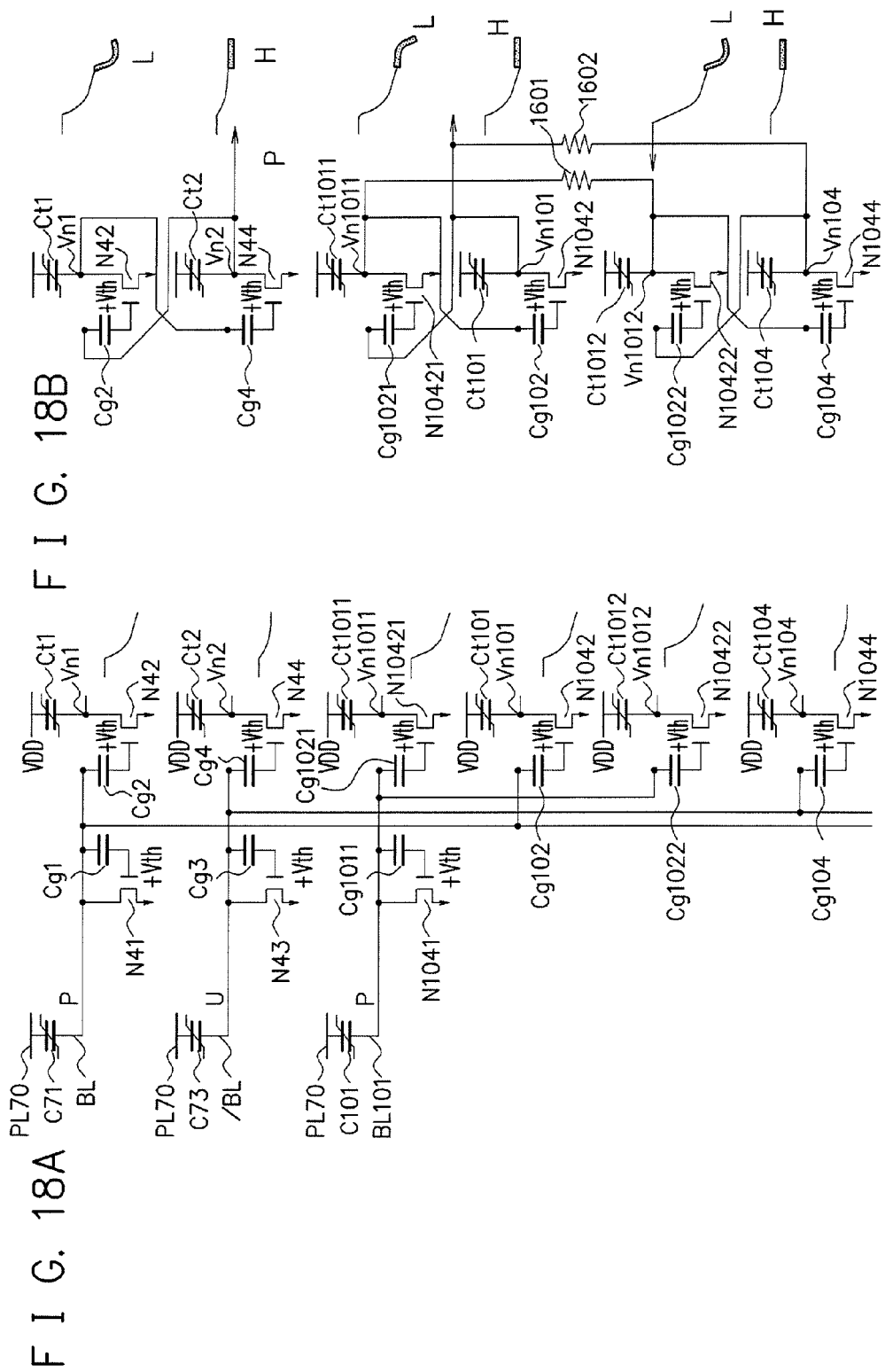
FIGS. 18A and 18B are diagrams illustrating amplifying and 1st step latching configuration examples of part of the memory cell array and the sense amplifier in FIG. 15 for reading P-term bit of a 1T1C cell.

FIG. 18A is a diagram, as with FIG. 16A, corresponding to the above-described integration operation in FIG. 9. FIG. 18B is a diagram, as with FIG. 16B, illustrating the latch operation by the cross-coupling of the above-described n-channel field effect transistors in FIG. 11. FIG. 19 is a diagram, as with FIG. 17, illustrating the latch operation by the cross-coupling of the above-described n-channel and p-channel field effect transistors in FIG. 12. Hereinafter, the points of FIGS. 18A, 18B and FIG. 19 different from FIGS. 16A, 16B and FIG. 17 will be explained.

First, in the integration operation in FIG. 18A, since the ferroelectric capacitor C101 is in the P-term state, a high voltage is outputted to the bit line BL101 a large current flows through the transistors N1041 and N10421, and the potential of the output node Vn1011 greatly decreases. Since the ferroelectric capacitor C101 is in the P-term state, a high voltage is outputted to the bit line BL101, a large current similarly flows through the transistor N10422, and the potential of the output node Vn1012 greatly decreases.

Next, as illustrated in FIG. 18B, the potential of the output node Vn1012 is latched at low level and the potential of the output node Vn104 is latched at high level by the latch operation by the cross-coupling of the n-channel field effect transistors N10422 and N1044. On the contrary, the potential of the output node Vn1011 and Vn101 are almost same thus they goes to a meta stable at the beginning of the latch operation and their potential level stays same by the latch operation by the cross-coupling of the n-channel field effect transistors N10421 and N1042 with virtual Vt compensated to 0 V.

Further, the output node Vn1011 is connected to the output node Vn1012 via the resistor 1601 and therefore decreases in potential after the latch N10422 and N1044 amplify and drives Vn1012 to low. As a result, the potential of the output node Vn1011 is latched at low level and the potential of the output node Vn101 is latched at high level by the latch operation by the cross-coupling of the n-channel field effect transistors N10421 and N1042.

Next, as illustrated in FIG. 19, the potential of the output node Vn1011 is latched at complete low level and the potential of the output node Vn101 is latched at complete high level by the latch operation by the cross-coupling of the p-channel field effect transistors P1011, P101 and the n-channel field effect transistors N10421, N1042.

Further, the potential of the output node Vn1012 is latched at complete low level and the potential of the output node Vn104 is latched at complete high level by the latch operation by the cross-coupling of the p-channel field effect transistors P1012, P104 and the n-channel field effect transistors N10422, N1044. Note that in this full CMOS latch period, n-channel field effect transistors are operated to have normal Vt without inserting offset capacitors Cg's.

Here, the high level at the output node Vn101 is outputted as the output signal of the sense amplifier 105 in FIG. 15. When the data "1" corresponding to the P-term state is stored in the single ferroelectric capacitor C101 cell, the high level is outputted from the output node Vn101. Thus, the data "1" stored in the single ferroelectric capacitor C101 cell can be read.

Figure 20:
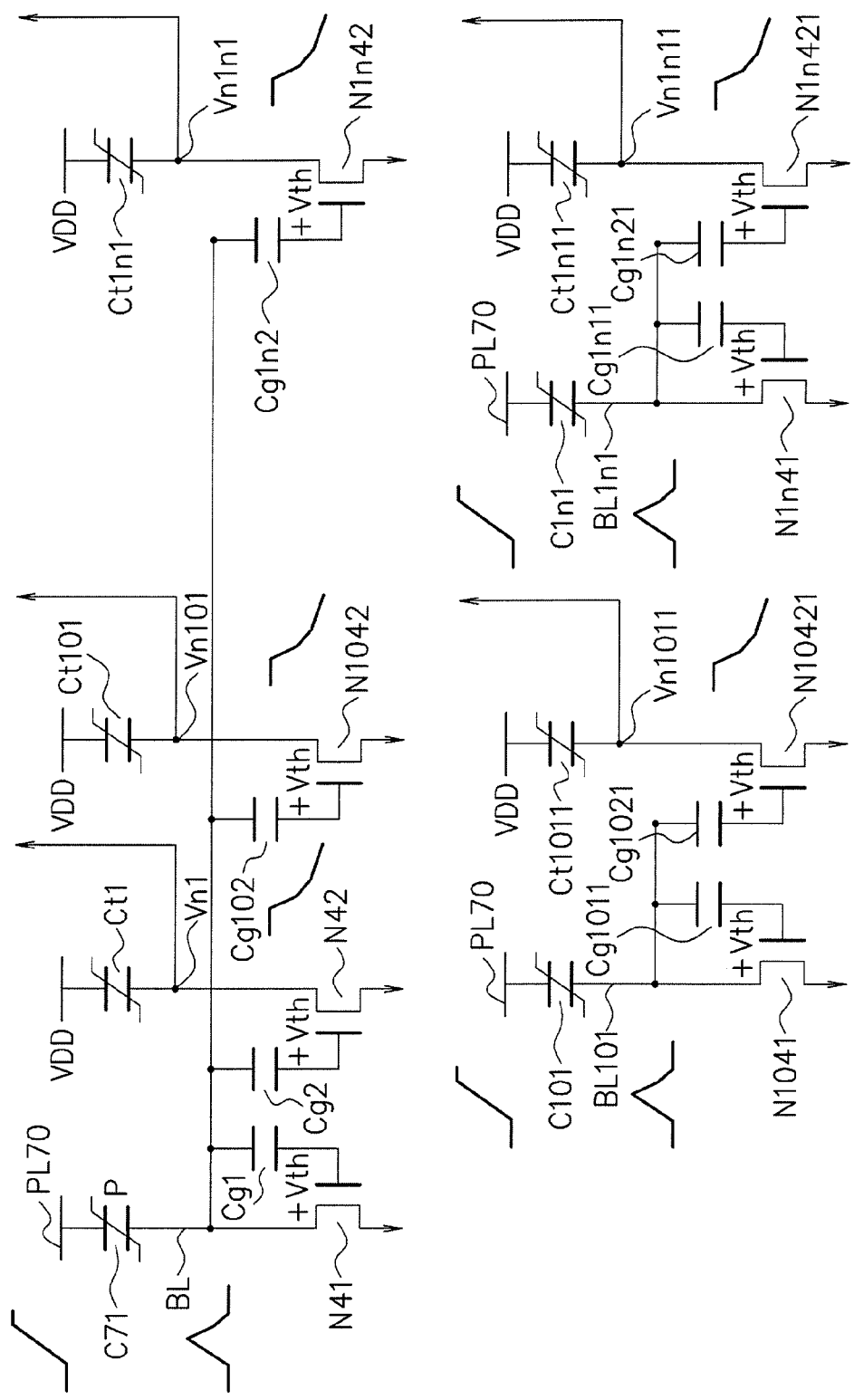
FIG. 20 is a diagram illustrating an amplifying configuration example of part of a ferroelectric memory device having ferroelectric capacitors of a reference generating cell and 1T1C n+1 normal memory cells.

FIG. 20 is a diagram illustrating a configuration example of part of a ferroelectric memory device having ferroelectric capacitors C101 to C1n1 of n+1 normal memory cells. In above FIG. 16A, the example of the ferroelectric memory device having the ferroelectric capacitors C71, C73 of two reference memory cells and the ferroelectric capacitor C101 of one capacitor memory cell is illustrated. In contrast, an example of the ferroelectric memory device having the ferroelectric capacitors C71, C73 of two reference memory cells and the ferroelectric capacitors C101 to C1n1 of the n+1 normal memory cells is illustrated in FIG. 20. Note that the ferroelectric capacitor C73 is not shown in FIG. 20. Hereinafter, the points of the circuit in FIG. 20 different from the circuit in FIG. 16A will be explained.

A circuit group of the ferroelectric capacitor C1n1 has the same configuration as the circuit group of the ferroelectric capacitor C101. The ferroelectric capacitor C1n1 corresponds to the ferroelectric capacitor C101 and is connected between the plate line PL70 and the bit line BL1n1. An n-channel field effect transistor N1n41 corresponds to the n-channel field effect transistor N1041 and has a drain connected to the bit line BL1n1 of the ferroelectric capacitor C1n1 and a source connected to the reference potential node.

A capacitor Cg1n11 is seen corresponding to the capacitor Cg1011 and is connected between the bit line BL1n1 of the ferroelectric capacitor C1n1 and the gate of the transistor N1n41. A capacitor Cg1n21 is seen corresponding to the capacitor Cg1021 and is connected between the bit line BL1n1 of the ferroelectric capacitor C1n1 and the gate of an n-channel field effect transistor N1n421. The n-channel field effect transistor N1n421 is seen corresponding to the transistor N10421 and has a drain connected to an output node Vn1n11 and a source connected to the reference potential node. A ferroelectric capacitor Ct1n11 is seen corresponding to the ferroelectric capacitor Ct1011 and is connected between the power supply potential node VDD and the output node Vn1n11.

A circuit group of a ferroelectric capacitor Ct1n1 has the same configuration as that of the circuit group of the ferroelectric capacitor Ct101. A capacitor Cg1n2 is seen corresponding to the capacitor Cg102 and is connected between the bit line BL of the ferroelectric capacitor C71 and a gate of an n-channel transistor N1n42. The n-channel transistor N1n42 is seen corresponding to the transistor N1042 and has a drain connected to an output node Vn1n1 and a source connected to the reference potential node. The ferroelectric capacitor Ct1n1 is seen corresponding to the capacitor Ct101 and is connected between the power supply potential node VDD and the output node Vn1n1. This makes it possible to distribute the same reference potential level as that of the output node Vn101 to the output node Vn1n1. Note that the complementary reference potential level is similarly distributed with the identical circuit also for the complementary reference ferroelectric capacitor C73.

Thereafter, as in FIG. 16B and FIG. 17, latch is performed based on the potentials of the output nodes Vn1n11 and Vn1n1 and the like. As in the above manner, the ferroelectric capacitors C101 to C1n1 of the n+1 single capacitor cells can be provided to store data of n+1 bits. Further, additional data of 1 bit can be stored in the complementary ferroelectric capacitors C71 and C73 cell.

Figure 21:
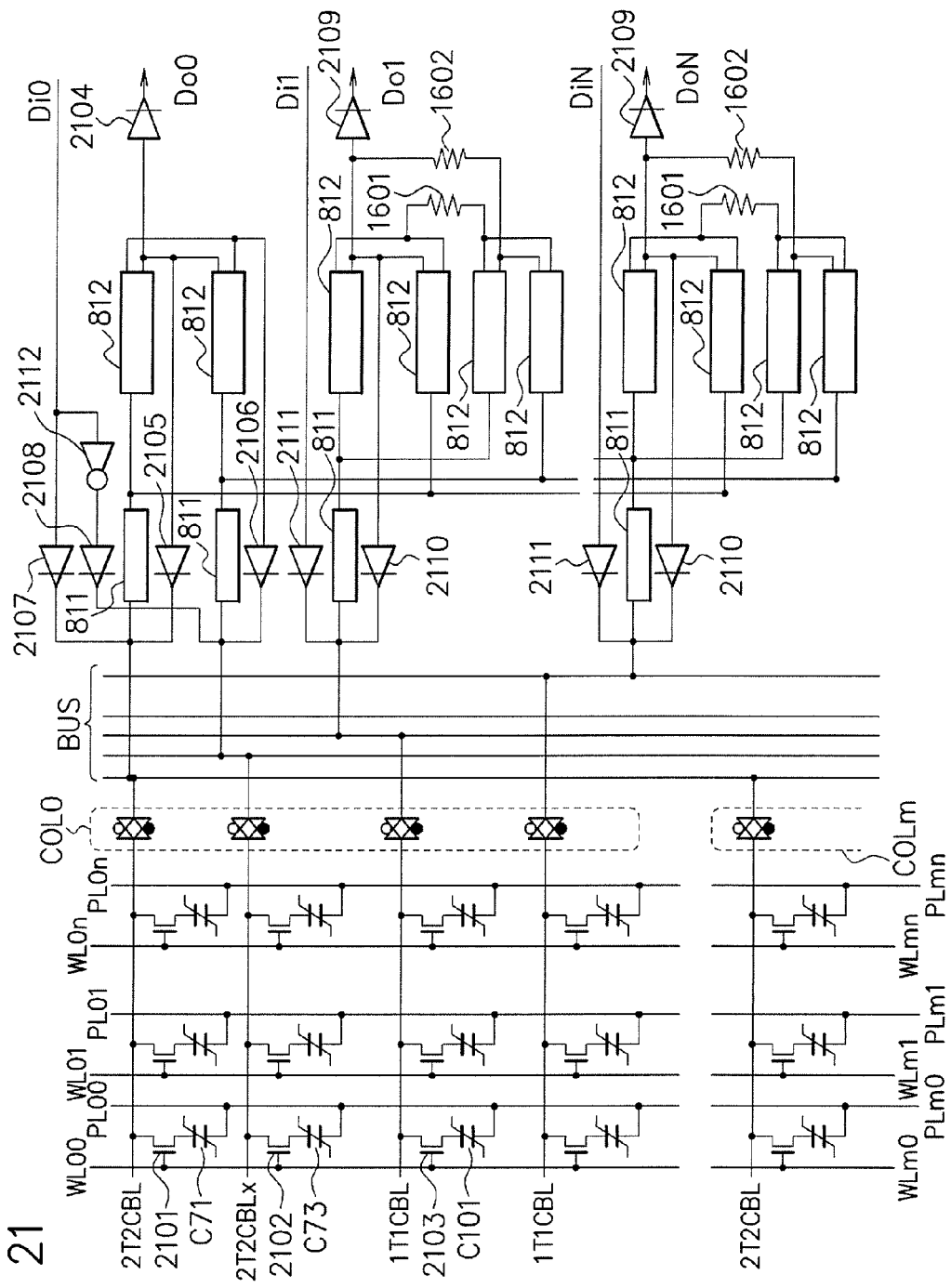
FIG. 21 is a diagram illustrating a configuration example of the memory cell array, a column decoder, and the sense amplifier in FIG. 15.

FIG. 21 is a diagram illustrating a configuration example of the memory cell array 103, the column decoder 104, and the sense amplifier 105 in FIG. 15. The ferroelectric capacitors C71, C73, C101 to C1n1 and the n-channel field effect transistors 2101 to 2103 are provided in the memory cell array 103 in FIG. 15. Column switches COL0 to COLm and a bus BUS are provided in the column decoder 104 in FIG. 15. Circuits 811, 812, resistors 1601, 1602, tri-state buffer circuits 2104 to 2111 and an inverter 2112 are provided in the sense amplifier 105 in FIG. 15.

The n+1 n-channel field effect transistors 2101 have drains connected to a bit line 2T2CBL and gates connected to word lines WL00 to WL0n respectively. The n+1 ferroelectric capacitors C71 are connected between sources of the n+1 transistors 2101 and plate lines PL00 to PL0n. The bit line 2T2CBL corresponds to the bit line BL in FIG. 16A, and the plate lines PL00 to PL0n correspond to the plate line PL70 in FIG. 16A. The transistors 2101 and the ferroelectric capacitors C71 constitute reference memory cells.

Further, the n+1 n-channel field effect transistors 2102 have drains connected to a bit line 2T2CBLx and gates connected to the word lines WL00 to WL0n respectively. The n+1 ferroelectric capacitors C73 are connected between the sources of the n+1 transistors 2102 and the plate lines PL00 to PL0n respectively. The bit line 2T2CBLx corresponds to the bit line /BL in FIG. 16A. The transistors 2102 and the ferroelectric capacitors C73 constitute reference memory cells.

Further, the n+1 ferroelectric capacitors C101 are connected between sources of n+1 n-channel field effect transistors 2103 and the plate lines PL00 to PL0n respectively. The n-channel field effect transistors 2103 have drains connected to a bit line 1T1CBL and gates connected to the word lines WL00 to WL0n respectively. The bit line 1T1CBL corresponds to the bit line BL101 in FIG. 16A. The transistors 2103 and the ferroelectric capacitors C101 constitute single capacitor memory cells.

Similarly, the n+1 ferroelectric capacitors C1n1 are connected between the sources of the n+1 n-channel field effect transistors 2103 and the plate lines PL00 to PL0n respectively. The n-channel field effect transistors 2103 have drains connected to another bit line 1T1CBL and gates connected to the word lines WL00 to WL0n respectively. The aforementioned another bit line 1T1CBL corresponds to the bit line BL101 in FIG. 16A. The transistors 2103 and the ferroelectric capacitors C1n1 constitute single capacitor memory cells.

When the word line WL00 becomes high level, the transistors 2101 to 2103 connected to the word line WL00 are turned on, and the data stored in the ferroelectric capacitors C71, C73, C101 to C1n1 are read to the bit lines 2T2CBL, 2T2CBLx, 1T1CBL via the transistors 2101 to 2103 connected to the word line WL00. Similarly, when one of the word lines WL01 to WL0n become high level, the data stored in the ferroelectric capacitors C71, C73, C101 to C1n1 corresponding to the word lines WL01 to WL0n are read to the bit lines 2T2CBL, 2T2CBLx, 1T1CBL. When a read address is designated, one of the word lines WL00 to WL0n selectively becomes high level.

According to the read address, one of m+1 column switches COL0 to COLm is turned on. For example, when the column switch COL0 is turned on, data read to the bit lines 2T2CBL, 2T2CBLx, 1T1CBL corresponding to the column switch COL0 are connected to the bus BUS.

The circuit 811 corresponds to the circuit 811 in FIG. 8, and the circuit 812 corresponds to the circuit 812 in FIG. 8. The resistors 1601 and 1602 correspond to the resistors 1601 and 1602 in FIG. 16B. The tri-state buffer circuit 2104 allows the data at the output node Vn2 in FIG. 17 to pass therethrough and outputs data Do0 when a read control signal is being high level, and brings the output into a high-impedance state when the read control signal is being low level. Further, the tri-state buffer circuits 2109 allow the data at the output node Vn101 and so on in FIG. 17 to pass therethrough and outputs data Do1 to DoN when the read control signal is being high level, and bring the outputs into a high-impedance state when the read control signal is being low level.

The tri-state buffer circuits 2105, 2106 and 2110 are tri-state buffer circuits for performing the above-described rewrite in FIG. 13. The tri-state buffer circuit 2105 allows the data at the output node Vn2 in FIG. 17 to pass therethrough and outputs the data to the bit line 2T2CBL when a rewrite control signal is being high level, and brings the output into a high-impedance state when the rewrite control signal is being low level. Similarly, the tri-state buffer circuit 2106 allows the data at the output node Vn1 in FIG. 17 to pass therethrough and outputs the data to the bit line 2T2CBLx when a rewrite control signal is being high level, and brings the output into a high-impedance state when the rewrite control signal is being low level. Similarly, the tri-state buffer circuits 2110 allow the data at the output node Vn101 and so on in FIG. 17 to pass therethrough and output the data to the bit line 1T1CBL when a rewrite control signal is being high level, and bring the outputs into a high-impedance state when the rewrite control signal is being low level.

The tri-state buffer circuits 2107, 2108, and 2111 are tri-state buffer circuits for writing input data Di0-DiN to the cells through BUSes and bitlines. The input data Di0 to DiN correspond to DT1 to DT16 in FIG. 15. An inverter 2112 outputs logical inversion data of the data Di0. The tri-state buffer circuit 2107 allows the data Di0 to pass therethrough and outputs the data to the bit line 2T2CBL when a write control signal is being high level, and brings the output into a high-impedance state when the write control signal is being low level. Similarly, the tri-state buffer circuit 2108 allows the output data from the inverter 2112 to pass therethrough and outputs the data to the bit line 2T2CBLx when a write control signal is being high level, and brings the output into a high-impedance state when the write control signal is being low level. Similarly, the tri-state buffer circuits 2111 allow the data Di1 to DiN to pass therethrough and output the data to the bit line 1T1CBL when a write control signal is being high level, and bring the outputs into a high-impedance state when the write control signal is being low level.

FIG. 22 is a timing chart illustrating examples of control signals of the ferroelectric memory device. Switch numbers are referring to FIG. 8. The switches sw2, sw12, and sw18 are turned on when control signals are at high level and turned off when the control signals are at low level. The switches sw15, sw17, and sw19 are turned on when control signals are at low level and turned off when the control signals are at high level.

A left path of the switch sw3 is turned on when a control signal sw3l becomes high level, and the left path of the switch sw3 is turned off when the control signal sw3l becomes low level. A left path of the switch sw13 is turned on when a control signal sw13l becomes high level, and the left path of the switch sw13 is turned off when the control signal sw13l becomes low level. A right path of the switch sw3 is turned on when a control signal sw3r becomes high level, and the right path of the switch sw3 is turned off when the control signal sw3r becomes low level. A right path of the switch sw13 is turned on when a control signal sw13r becomes high level, and the right path of the switch sw13 is turned off when the control signal sw13r becomes low level. A right path of the switch sw4 is turned on when a control signal sw4r becomes high level, and the right path of the switch sw4 is turned off when the control signal sw4r becomes low level. A right path of the switch sw16 is turned on when a control signal sw16r becomes high level, and the right path of the switch sw16 is turned off when the control signal sw16r becomes low level. A left path of the switch sw4 is turned on when a control signal sw4l becomes high level, and the left path of the switch sw4 is turned off when the control signal sw4l becomes low level. A left path of the switch sw16 is turned on when a control signal sw16l becomes high level, and the left path of the switch sw16 is turned off when the control signal sw16l becomes low level. A left path of the switch sw1 is turned on when a control signal sw1l becomes high level, and the left path of the switch sw1 is turned off when the control signal sw1l becomes low level. A left path of the switch sw11 is turned on when a control signal sw11l becomes high level, and the left path of the switch sw11 is turned off when the control signal sw11l becomes low level. A right path of the switch sw1 is turned on when a control signal sw1r becomes high level, and the right path of the switch sw1 is turned off when the control signal sw1r becomes low level. A right path of the switch sw11 is turned on when a control signal sw11r becomes high level, and the right path of the switch sw11 is turned off when the control signal sw11r becomes low level. A right path of the switch sw14 is turned on when a control signal sw14r becomes high level, and the right path of the switch sw14 is turned off when the control signal sw14r becomes low level. A left path of the switch sw14 is turned on when a control signal sw14*l* becomes high level, and the left path of the switch sw14 is turned off when the control signal sw14*l* becomes low level.

Period 2201 corresponds to the pre-charge operation in FIG. 7A, during which the switches sw2 and sw12 are being on. The switch sw3 is connected to the drain of the transistor N41, and the switch sw13 is connected to the drain of the transistor N42. The switch sw4 is connected to the reference potential node, and the switch sw16 (FIG. 8) is connected to the reference potential node. The switch sw15 is being on. The switch sw1 is connected to the resistor R1, and the switch sw11 is connected to the resistor R11. The switch sw17 (FIG. 8) is being on, and the switch sw19 (FIG. 8) is being off. The switch sw14 (FIG. 8) is not connected to anything but becomes open. The switch sw18 (FIG. 8) is being off.

Since a control signal W1 is at low level, outputs of the tri-state buffer circuits 2104, 2105, 2109, 2110 are being a high-impedance state. Since a control signal W2 is also at low level, outputs of the tri-state buffer circuits 2107, 2108, 2111 are being a high-impedance state. Further, one of the column switches COL0 to COLm is being on. Further, the word lines WL00 to WL0*n* are at low level. Further, the plate lines PL00 to PL0*n* are at low level.

Next, period 2202 corresponds to the integration operation in FIG. 9, during which the switches sw2 and sw12 are turned off. The switch sw3 is connected to the capacitor Cg1, and the switch sw13 is connected to the capacitor Cg2. The switch sw4 is connected to the drain of the transistor N41, and the switch sw16 is connected to the switch sw14. The switch sw15 is turned off. The switch sw1 is connected to the ferroelectric capacitor C71, and the switch sw11 is connected to the ferroelectric capacitor Ct1. The switch sw17 is being on, and the switch sw19 is being off. The switch sw14 is connected to the drain of the transistor N41. The switch sw18 is being off.

Since the control signal W1 is at low level, outputs of the tri-state buffer circuits 2104, 2105, 2109, 2110 is being a high-impedance state. Since the control signal W2 is at low level, outputs of the tri-state buffer circuits 2107, 2108, 2111 is being a high-impedance state. Further, one of the column switches COL0 to COLm is turned on. Further, one of the word lines WL00 to WL0*n* becomes high level, and one of the plate lines PL00 to PL0*n* becomes high level.

Next, period 2203 corresponds to the latch operation by the cross-coupling of the n-channel field effect transistors as is in FIG. 10 and FIG. 11, during which the switches sw2 and sw12 are being off. The switch sw3 is connected to the capacitor Cg1, and the switch sw13 is connected to the capacitor Cg2. The switch sw4 is connected to the drain of the transistor N41, and the switch sw16 is connected to the switch sw14. The switch sw15 is being off. The switch sw1 is connected to C71. The switch sw11 is connected to the ferroelectric capacitor Ct1. The switch sw17 is being on, and the switch sw19 is being off. The switch sw14 is connected to the gate of the transistor N42. The switch sw18 is being off.

Next, period 2204 corresponds to the latch operation by the cross-coupling of the p-channel and n-channel field effect transistors as is in FIG. 12, during which the switches sw2 and sw12 are being off. The switch sw3 is connected to the capacitor Cg1, and the switch sw13 is connected to the capacitor Cg2. The switch sw4 is connected to the drain of the transistor N41, and the switch sw16 is connected to the switch sw14. The switch sw15 is being off. The switches sw1 and sw11 are connected to anything but become open. The switch sw17 is being on, and the switch sw19 is turned on. The switch sw14 is connected to anything but becomes open. The switch sw18 is turned on.

Next, period 2205 corresponds to the rewrite operation in FIG. 13, during which the tri-state buffer circuits 2105, 2106, 2110 (in FIG. 21) corresponding to the switch sw20 (in FIG. 13) are turned on by the control signal W1. Further, the control signal W1 becomes high level, and the tri-state buffer circuits 2104, 2105, 2109, 2110 allow input signals to pass therethrough and output them to BLs and device output terminals of Do0-DoN. Note that in the write operation, the control signal W2 becomes high level, and the tri-state buffer circuits 2107, 2108, 2111 allow input signals to pass therethrough and output them to BLs, instead of driving the W1 to high level. Thereafter, the plate lines PL00 to PL0*n* become low level, and the word lines WL00 to WL0*n* then become low level. Thereafter, the column switches COL0 to COLm are turned off.

According to this embodiment, the nonvolatile latch circuits in the first to third embodiments can be used as the ferroelectric memory device. The ferroelectric capacitors C71 and C73 store complementary data and store information of 1 bit as well as have the function as the ferroelectric capacitors of the reference memory cells. The ferroelectric capacitors C101 to C1*n*1 in the normal memory cells, the potentials of the ferroelectric capacitors C71 and C73 are read as the reference potentials during the latch operation. The ferroelectric memory device can store the data of 1 bit stored in the ferroelectric capacitors C71 and C73 and the data of n+1 bits stored in the ferroelectric capacitors C101 to C1*n*1. Further, in this embodiment, the information can be read from a ferroelectric capacitor by applying a high voltage to the ferroelectric capacitor as in the first to third embodiments, so that the read operation can be stably performed even at a low power supply voltage.

Incidentally, the above-described embodiment is to be considered in all respects as illustrative and no restrictive. Namely, the present invention may be embodied in other specific forms without departing from the spirit or essential characteristics thereof.

Since information can be read from a first ferroelectric capacitor by applying a high voltage to the first ferroelectric capacitor, read operation can be stably performed even at a low power supply voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A nonvolatile latch circuit, comprising:
   a latch circuit;
   a charge absorption circuit; and
   a first ferroelectric capacitor including a first electrode connected to a plate line and a second electrode connected to the charge absorption circuit,
   wherein:
   when information is read from the first ferroelectric capacitor to the latch circuit, the plate line is operated to cause the charge absorption circuit to absorb at least part of charges outputted from the first ferroelectric capacitor so as to suppress a variation in a potential of the second electrode of the first ferroelectric capacitor;

the charge absorption circuit comprises:
a second ferroelectric capacitor that absorbs the at least part of charges, and
a first transistor having a drain connected to the second electrode of the first ferroelectric capacitor and a source connected to a reference potential node; and
the nonvolatile latch circuit further comprises:
a third ferroelectric capacitor having a first electrode connected to a power supply potential node and a second electrode connected to the latch circuit;
a first current mirror circuit that draws a current resulting from mirroring a current of the first transistor, from the second electrode of the third ferroelectric capacitor, and
a charge transfer circuit that transfers charges from the first ferroelectric capacitor to the second ferroelectric capacitor.

2. The nonvolatile latch circuit according to claim 1, wherein the charge absorption circuit comprises:
a first capacitor;
a first switch that selectively connects a first electrode of the first capacitor to the reference potential node or the second electrode of the first ferroelectric capacitor; and
a second switch that selectively connects a second electrode of the first capacitor to a node at a voltage corresponding to a threshold value of the first transistor or a gate of the first transistor, and
wherein before information is read from the first ferroelectric capacitor to the latch circuit, the first capacitor is pre-charged with the voltage corresponding to the threshold value of the first transistor.

3. The nonvolatile latch circuit according to claim 2, wherein the first current mirror circuit comprises:
a second transistor having a drain connected to the second electrode of the third ferroelectric capacitor and a source connected to the reference potential node;
a second capacitor;
a third switch that selectively connects a first electrode of the second capacitor to the reference potential node or the second electrode of the first ferroelectric capacitor, and
a fourth switch that selectively connects a second electrode of the second capacitor to a node at a voltage corresponding to a threshold value of the second transistor or a gate of the second transistor, and
wherein before information is read from the first ferroelectric capacitor to the latch circuit, the second capacitor is pre-charged with the voltage corresponding to the threshold value of the second transistor.

4. The nonvolatile latch circuit according to claim 3, wherein the latch circuit comprises a third transistor and is configured to perform a latch operation using the third transistor and the second transistor.

5. The nonvolatile latch circuit according to claim 1, further comprising a plurality of sets of the first ferroelectric capacitor, the charge absorption circuit, the third ferroelectric capacitor, and the first current mirror circuit corresponding to a plurality of complementary terminals of the latch circuit.

6. A memory device, comprising:
a nonvolatile latch circuit; and
a plurality of normal memory cells connected to a plurality of word lines and a plurality of bit lines,
wherein the nonvolatile latch circuit comprises:
a latch circuit;
a charge absorption circuit; and
a first ferroelectric capacitor having a first electrode connected to a plate line and a second electrode connected to the charge absorption circuit,
wherein when information is read from the first ferroelectric capacitor to the latch circuit, the plate line is operated to cause the charge absorption circuit to absorb at least part of charges outputted from the first ferroelectric capacitor so as to suppress a variation in a potential of the second electrode of the first ferroelectric capacitor,
wherein the charge absorption circuit comprises a first transistor having a drain connected to the second electrode of the first ferroelectric capacitor and a source connected to a reference potential node,
wherein the nonvolatile latch circuit further comprises:
a third ferroelectric capacitor having a first electrode connected to a power supply potential node and a second electrode connected to the latch circuit; and
a first current mirror circuit that draws a current resulting from mirroring a current of the first transistor, from the second electrode of the third ferroelectric capacitor,
wherein the first ferroelectric capacitor is provided in a reference memory cell,
wherein the latch circuit comprises a sense amplifier, and
wherein the sense amplifier amplifies and holds charges transferred from a selected normal memory cell based on charges of the third ferroelectric capacitor.

7. The memory device according to claim 6, further comprising:
a plurality of the third ferroelectric capacitors; and
a plurality of the first current mirror circuits, wherein the plurality of first current mirror circuits draw a current resulting from mirroring a current of the first transistor, from the plurality of third ferroelectric capacitors.

8. The memory device according to claim 6, wherein the normal memory cell comprises:
a fourth ferroelectric capacitor having a first electrode connected to a plate line and a second electrode connected to the bit line;
a fourth transistor having a drain connected to the bit line and a source connected to a reference potential node;
a fifth ferroelectric capacitor having a first electrode connected to a power supply potential node and a second electrode connected to the latch circuit; and
a second current mirror circuit that draws a current resulting from mirroring a current of the fourth transistor, from a second electrode of the fourth ferroelectric capacitor.

* * * * *